US012757763B2

(12) United States Patent
Kim et al.

(10) Patent No.: US 12,757,763 B2
(45) Date of Patent: Oct. 6, 2026

(54) SEMICONDUCTOR PACKAGE

(71) Applicant: Samsung Electronics Co., Ltd., Suwon-si (KR)

(72) Inventors: Cheol Kim, Suwon-si (KR); Seokhyun Lee, Suwon-si (KR); Seokgeun Ahn, Suwon-si (KR); Hwanyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 514 days.

(21) Appl. No.: 18/236,090

(22) Filed: Aug. 21, 2023

(65) Prior Publication Data

US 2024/0063103 A1 Feb. 22, 2024

(30) Foreign Application Priority Data

Aug. 22, 2022 (KR) ........................ 10-2022-0104912

(51) Int. Cl.
*H10W 70/65* (2026.01)
*H10W 70/60* (2026.01)
(Continued)

(52) U.S. Cl.
CPC ......... *H10W 70/65* (2026.01); *H10W 70/685* (2026.01); *H10W 70/69* (2026.01); (Continued)

(58) Field of Classification Search
CPC ............... H10W 70/65; H10W 70/652; H10W 70/6528; H10W 70/655; H10W 70/656; (Continued)

(56) References Cited

U.S. PATENT DOCUMENTS 7,304,384 B2 12/2007 Koike et al.
7,718,524 B2 5/2010 Ooka
(Continued)

FOREIGN PATENT DOCUMENTS

JP 2016201470 A 12/2016
KR 1020090058008 A 6/2009
KR 1020220009193 A 1/2022

*Primary Examiner* — Scott B Geyer
(74) *Attorney, Agent, or Firm* — Muir Patent Law, PLLC

(57) ABSTRACT

A semiconductor package includes a first redistribution structure including a top surface, a chip arranged on the top surface of the first redistribution structure the chip having a top surface, bottom surface, and side surfaces, and a package body arranged on the top surface of the first redistribution structure to cover the side surfaces of the chip. The first redistribution structure includes a plurality of redistribution layers stacked in a vertical direction, a plurality of redistribution insulating layers stacked in the vertical direction and which insulate the plurality of redistribution layers from each other, a plurality of redistribution vias buried in a plurality of redistribution via holes penetrating the plurality of redistribution insulating layers and electrically connecting the plurality of redistribution layers to each other, and a plurality of self-formed barrier layers formed between side surfaces of the plurality of redistribution layers and the plurality of redistribution insulating layers.

20 Claims, 21 Drawing Sheets

(51) Int. Cl.

| | |
|---|---|
| ***H10W 70/655*** | (2026.01) |
| ***H10W 70/656*** | (2026.01) |
| ***H10W 70/68*** | (2026.01) |
| ***H10W 70/685*** | (2026.01) |
| ***H10W 70/69*** | (2026.01) |
| ***H10W 74/10*** | (2026.01) |
| ***H10W 90/00*** | (2026.01) |

(52) U.S. Cl.
CPC .......... *H10W 74/111* (2026.01); *H10W 90/00* (2026.01); *H10W 70/60* (2026.01); *H10W 70/655* (2026.01); *H10W 70/656* (2026.01); *H10W 70/682* (2026.01); *H10W 90/722* (2026.01); *H10W 90/724* (2026.01); *H10W 90/794* (2026.01)

(58) Field of Classification Search
CPC ... H10W 70/66; H10W 70/68; H10W 70/682; H10W 70/685; H10W 70/69; H10W 70/63
See application file for complete search history.

(56) References Cited

U.S. PATENT DOCUMENTS

| | | | | |
|---|---|---|---|---|
| 8,492,808 | B2 | 7/2013 | Omori et al. | |
| 8,766,342 | B2 | 7/2014 | Akolkar | |
| 8,779,590 | B2 | 7/2014 | Isobayashi | |
| 9,129,967 | B2 | 9/2015 | Tsai et al. | |
| 9,953,911 | B2 | 4/2018 | Chiu et al. | |
| 9,953,926 | B2 | 4/2018 | Yu et al. | |
| 10,103,107 | B1 * | 10/2018 | Lu | H10W 42/20 |
| 10,157,864 | B1 | 12/2018 | Yu et al. | |
| 10,431,544 | B2 | 10/2019 | Briggs et al. | |
| 10,665,542 | B2 | 5/2020 | Yu et al. | |
| 11,145,611 | B2 | 10/2021 | Kim et al. | |
| 11,328,970 | B2 | 5/2022 | Park et al. | |
| 2011/0304999 | A1 * | 12/2011 | Yu | H10W 20/023 29/829 |
| 2013/0009322 | A1 * | 1/2013 | Conn | H10W 20/023 257/E21.59 |
| 2016/0300804 | A1 * | 10/2016 | Omori | H10W 74/131 |
| 2019/0035756 | A1 * | 1/2019 | Min | H10P 54/00 |
| 2019/0051607 | A1 * | 2/2019 | Suk | H10W 70/614 |
| 2019/0189599 | A1 * | 6/2019 | Baloglu | H10W 40/258 |
| 2020/0051935 | A1 * | 2/2020 | Molgg | H10W 20/039 |
| 2020/0075496 | A1 * | 3/2020 | Yu | H10W 70/614 |
| 2020/0083201 | A1 * | 3/2020 | Suk | H10W 70/09 |
| 2021/0057382 | A1 * | 2/2021 | Chen | H10P 72/74 |
| 2022/0068848 | A1 * | 3/2022 | Huang | H10W 20/42 |
| 2022/0328387 | A1 * | 10/2022 | Lau | H10W 70/685 |
| 2023/0005806 | A1 * | 1/2023 | Kwon | H10W 74/117 |
| 2023/0187389 | A1 * | 6/2023 | Sciarrillo | C23C 16/403 324/762.02 |
| 2023/0307340 | A1 * | 9/2023 | Heo | H10W 70/685 |
| 2023/0352418 | A1 * | 11/2023 | Lin | H10W 70/09 |
| 2024/0178120 | A1 * | 5/2024 | Weng | H10W 70/65 |
| 2024/0178176 | A1 * | 5/2024 | Jang | H10B 80/00 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2022-0104912, filed on Aug. 22, 2022, in the Korean Intellectual Property Office, the disclosure of which is incorporated by reference herein in its entirety.

BACKGROUND

Aspects of the inventive concept relate to a semiconductor package, and more particularly, to a semiconductor package including a redistribution structure.

As the integration of chips (or semiconductor chips) is improved, sizes of the chips are gradually reduced. A semiconductor package including a redistribution structure used to redistribute an arrangement of chip pads is being used more often. Accordingly, the importance of the mechanical and electrical reliability of the redistribution structure is increases.

SUMMARY

Aspects of the inventive concept provide a semiconductor package capable of improving the mechanical and electrical reliability of a redistribution structure.

According to an aspect of the inventive concept, a semiconductor package includes a first redistribution structure including a top surface, a chip arranged on the top surface of the first redistribution structure the chip having a top surface, bottom surface, and side surfaces, and a package body arranged on the top surface of the first redistribution structure to cover the side surfaces of the chip. The first redistribution structure includes a plurality of redistribution layers stacked in a vertical direction, a plurality of redistribution insulating layers stacked in the vertical direction and which insulate the plurality of redistribution layers from each other, a plurality of redistribution vias buried in a plurality of redistribution via holes penetrating the plurality of redistribution insulating layers and electrically connecting the plurality of redistribution layers to each other, and a plurality of self-formed barrier layers formed between side surfaces of the plurality of redistribution layers and the plurality of redistribution insulating layers.

According to another aspect of the inventive concept, a semiconductor package includes a first redistribution structure including a top surface, a chip arranged on the top surface of first redistribution structure, the chip having a top surface, bottom surface, and side surfaces, and a package body arranged on the first redistribution structure to cover the side surfaces of the chip. The first redistribution structure includes a plurality of redistribution layers stacked in a vertical direction, a plurality of redistribution insulating layers stacked in the vertical direction and which insulate the plurality of redistribution layers from each other, a plurality of redistribution vias buried in a plurality of redistribution via holes penetrating the plurality of redistribution insulating layers and electrically connecting redistribution layers of the plurality of redistribution layers to each other, a plurality of barrier layers formed between upper surfaces and side surfaces of the plurality of redistribution layers and the plurality of redistribution insulating layers, and a plurality of barrier seed layers formed on lower surfaces of the plurality of redistribution layers and side surfaces and lower surfaces of the plurality of redistribution vias and between the plurality of redistribution insulating layers.

According to another aspect of the inventive concept, a semiconductor package includes a first redistribution structure having a top surface, a chip arranged on the top surface of the first redistribution structure, the chip having a top surface, bottom surface, and side surfaces, and a package body arranged on the first redistribution structure to cover the side surfaces of the chip. The first redistribution structure includes a plurality of redistribution layers stacked in a vertical direction, a plurality of redistribution insulating layers that insulate the plurality of redistribution layers from each other, a plurality of redistribution vias buried in a plurality of redistribution via holes penetrating the plurality of redistribution insulating layers and electrically connecting the plurality of redistribution layers to each other, and a plurality of barrier layers formed between upper surfaces, side surfaces, and lower surfaces of the plurality of redistribution layers and the plurality of redistribution insulating layers, and between side surfaces of the plurality of redistribution vias and the plurality of redistribution insulating layers.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Hereinafter, one or more embodiments of the inventive concept are described in detail with reference to the attached drawings.

Figure 1:
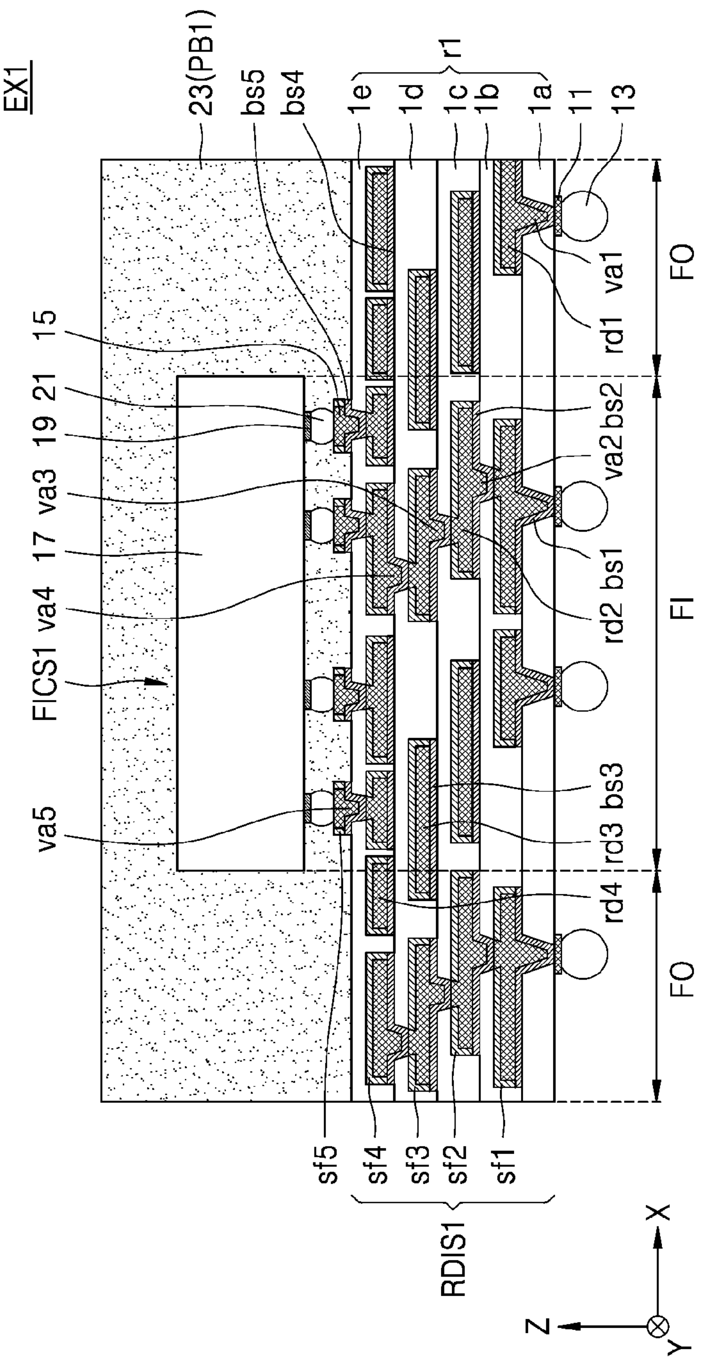
FIG. 1 is a cross-sectional view of a semiconductor package according to an embodiment.
Figure 2:
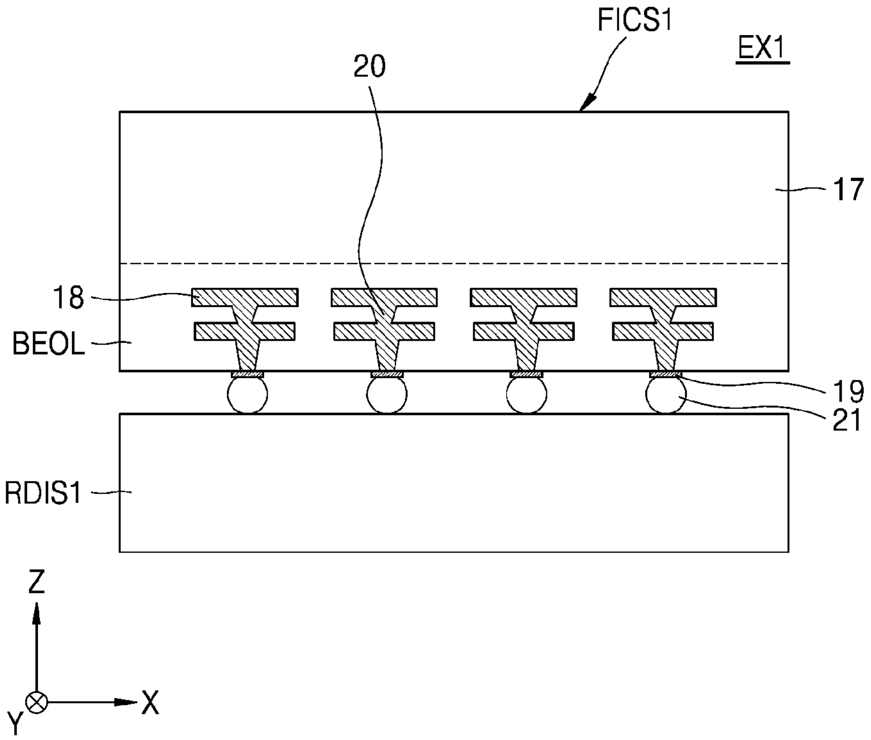
FIG. 2 is an enlarged view for explaining a connection relationship between a chip and a first redistribution structure of FIG. 1.
Figure 3:
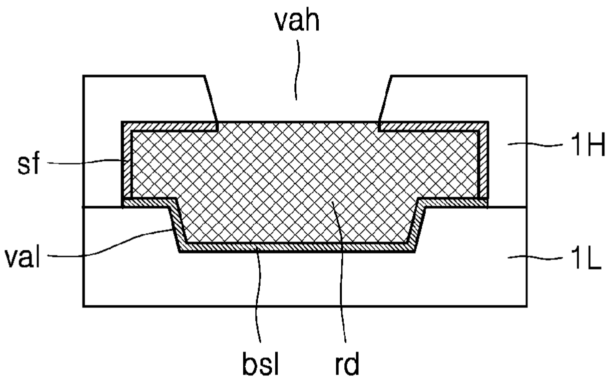
FIG. 3 is a partial enlarged view for explaining a first redistribution structure of FIG. 1.

FIG. 1 is a cross-sectional view of a semiconductor package according to an embodiment, FIG. 2 is an enlarged view for explaining a connection relationship between a chip and a first redistribution structure of FIG. 1, and FIG. 3 is a partial enlarged view for explaining the first redistribution structure of FIG. 1.

In detail, a semiconductor package EX1 may include a first redistribution structure RDIS1, a chip 17, and an encapsulation layer 23. The semiconductor package EX1 may be a fan-out semiconductor package. The chip 17 may be arranged on the first redistribution structure RDIS1, for example on a top surface of first redistribution structure RDIS1, which may be a substantially planar surface.

A width of the first redistribution structure RDIS1 may be greater than that of the chip 17. The encapsulation layer 23 may be formed on the first redistribution structure RDIS1 to cover side surfaces of the chip 17 (e.g., opposite side surfaces, or all side surfaces). The encapsulation layer 23 may be a molding layer. The encapsulation layer 23 may include or be formed of an Epoxy Molding Compound (EMC).

The semiconductor package EX1 may include a package body PB1 that has a fan-in area FI, where the chip 17 is arranged, and fan-out areas FO arranged on both sides of the fan-in area FI. The fan-out areas FO may surround the fan-in area FI in a plan view. The encapsulation layer 23 may form the package body PB1.

In the semiconductor package EX1, a fan-in chip structure FICS1 including the chip 17 may be arranged in the fan-in area FI. In some embodiments, the first redistribution structure RDIS1 corresponding to the fan-in chip structure FICS1 may correspond to the fan-in area FI. A portion of the package body PB1, except for the fan-in chip structure FICS1, and a portion of the first redistribution structure RDIS1 corresponding to the package body PB1 may correspond to the fan-out areas FO. The semiconductor package EX1 may be of a Fan Out wafer Level Package (FOWLP) type.

As shown in FIG. 2, the chip 17 may include a back-end level wiring layer BEOL. The back-end level wiring layer BEOL may include a back-end wiring layer 18 and a back-end via layer 20. The back-end level wiring layer BEOL may be electrically connected to a chip pad 19. The chip pad 19 may be electrically connected to the first redistribution structure RDIS1 through an internal connection terminal 21. The internal connection terminal 21 may be a solder ball or a solder bump, for example.

The chip 17 may be a logic chip, a power management integrated circuit (PMIC) chip, or a memory chip. In some embodiments, the logic chip may be a memory controller chip, a central processing unit (CPU) chip, a graphics processing unit (GPU) chip, or an application processor (AP) chip.

In some embodiments, the memory chip may be a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip. In the present embodiment, the chip 17 is a single chip in the semiconductor package EX1, but the chip 17 may be a stack chip in which a plurality of chips are vertically stacked.

The first redistribution structure RDIS1 includes a plurality of redistribution layers rd1, rd2, rd3, and rd4 stacked in a vertical direction (a Z direction), a plurality of redistribution insulating layers 1*a*, 1*b*, 1*c*, 1*d*, and 1*e* that insulate the redistribution layers rd1, rd2, rd3, and rd4 from each other, and a plurality of redistribution vias va1, va2, va3, va4, and va5 that electrically connect the redistribution layers rd1, rd2, rd3, and rd4 to each other through the redistribution insulating layers 1*a*, 1*b*, 1*c*, 1*d*, and 1*e*.

The redistribution insulating layers 1*a*, 1*b*, 1*c*, 1*d*, and 1*e* may constitute a redistribution insulating structure r1. The redistribution insulating layers 1*a*, 1*b*, 1*c*, 1*d*, and 1*e* may each be a polymer insulating layer including oxygen atoms. The redistribution insulating layers 1*a*, 1*b*, 1*c*, 1*d*, and 1*e* may each be a Photo Imageable Dielectric (PID) layer. The redistribution insulating layers 1*a*, 1*b*, 1*c*, 1*d*, and 1*e* may include a first redistribution insulating layer 1*a*, a second redistribution insulating layer 1*b*, a third redistribution insulating layer 1*c*, a fourth redistribution insulating layer 1*d*, and a fifth redistribution insulating layer 1*e*. Each redistribution layer 1*a*, 1*b*, 1*c*, 1*d*, or 1*e* may be a single layer (e.g., a film) of a homogenous, continuous material.

The redistribution layers rd1, rd2, rd3, and rd4 may include a first redistribution layer rd1, a second redistribution layer rd2, a third redistribution layer rd3, and a fourth redistribution layer rd4. In the present embodiment, there are four redistribution layers rd1, rd2, rd3, and rd4, but there may be at least two redistribution layers.

The redistribution layers rd1, rd2, rd3, and rd4 may include or be formed of metal alloys including base metal and doping metal doped in the base metal. In some embodiments, the base metal may be copper (Cu), and the doping metal may be chromium (Cr) or cobalt (Co). In some embodiments, the doping metal may be included in the base metal in a range from about 0.1 wt % to about 3 wt %.

In some embodiments, the base metal may be Cu, and the doping metal may be any one selected from among vanadium (V), iron (Fe), manganese (Mn), titanium (Ti), molybdenum (Mo), nickel (Ni), zinc (Zn), magnesium (Mg), and aluminum (Al). In some embodiments, the doping metal may be included in the base metal in a range from about 0.1 wt % to about 3 wt %. The redistribution layers rd1, rd2, rd3, and rd4 may each include a plurality of redistribution patterns that are arranged apart from each other in a horizontal direction (an X direction). Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first redistribution structure RDIS1 includes a plurality of barrier seed layers bs1, bs2, bs3, bs4, and bs5 formed on lower surfaces of the redistribution layers rd1, rd2, rd3, and rd4 and side surfaces and lower surfaces of the redistribution vias va1, va2, va3, va4, and va5 and formed between the redistribution insulating layers 1*a*, 1*b*, 1*c*, 1*d*, and 1*e*, and barrier layers sf1, sf2, sf3, sf4, and sf5 formed on side and top surfaces of the redistribution layers rd1, rd2, rd3, and rd4 and between the redistribution insulating layers 1*a*, 1*b*, 1*c*, 1*d*, and 1*e*.

In some embodiments, the barrier seed layers bs1, bs2, bs3, bs4, and bs5 may each be a double layer including a barrier layer, for example, a Ti layer, and a seed layer, for example, a Cu layer. In some embodiments, the barrier seed layers bs1, bs2, bs3, bs4, and bs5 may each be a single layer, for example, a Cu layer.

The self-forming barrier layers sf1, sf2, sf3, sf4, and sf5 may each be a metal oxide layer. The self-forming barrier layers sf1, sf2, sf3, sf4, and sf5 may each be a metal oxide layer formed because of a reaction of a doping metal, which is doped into the base metal forming the redistribution layers rd1, rd2, rd3, and rd4, with oxygen included in the redistribution insulating layers 1*a*, 1*b*, 1*c*, 1*d*, and 1*e*. The base metal constituting the redistribution layers rd1, rd2, rd3, and rd4 and the doping metal may be optimum examples for a reaction with the redistribution insulating layers 1*a*, 1*b*, 1*c*, 1*d*, and 1*e* from a thermodynamic point of view.

The self-forming barrier layers sf1, sf2, sf3, sf4, and sf5 may respectively cover redistribution patterns constituting the redistribution layers rd1, rd2, rd3, and rd4. The self-forming barrier layers sf1, sf2, sf3, sf4, and sf5 may include a first self-forming barrier layer sf1, a second self-forming barrier layer sf2, a third self-forming barrier layer sf3, a fourth self-forming barrier layer sf4, and a fifth self-forming barrier layer sf5. The self-forming barrier layers sf1, sf2, sf3, sf4, and sf5 may prevent the diffusion of metal elements, e.g., Cu, which form the redistribution layers rd1, rd2, rd3, and rd4.

The self-forming barrier layers sf1, sf2, sf3, sf4, and sf5 may be formed by making the redistribution layers rd1, rd2, rd3, and rd4 and the redistribution insulating layers 1*a*, 1*b*, 1*c*, 1*d*, and 1*e* react (for example, be cured) at a low temperature, e.g., a process temperature less than or equal to about 250° C.

The redistribution vias va1, va2, va3, va4, and va5 may include a first redistribution via va1, a second redistribution via va2, a third redistribution via va3, a fourth redistribution via va4, and a fifth redistribution via va5. The redistribution vias va1, va2, va3, va4, and va5 may include the same materials as the redistribution layers rd1, rd2, rd3, and rd4.

The first redistribution via va1 may penetrate the first redistribution insulating layer 1*a*. The second redistribution via va2 to the fifth redistribution via va5 may penetrate the second redistribution insulating layer 1*b* to the fifth redistribution insulating layer 1*e*, respectively. The first redistribution via va1 may be a redistribution via for external connection. The first redistribution via va1 may be connected to a first redistribution pad 11, and the first redistribution pad 11 may be connected to a first external connection terminal 13.

The second redistribution via va2 to the fourth redistribution via va4 may electrically connect the first and second redistribution layers rd1 and rd2, the second and third redistribution layers rd2 and rd3, and the third and fourth redistribution layers rd3 and rd4, respectively.

The fifth redistribution via va5 may be a redistribution via for chip connection. A second redistribution pad 15 may be arranged on the fifth redistribution via va5, and an internal connection terminal 21 may be connected to the second redistribution pad 15.

In FIG. 1, the chip pad 19 of the chip 17 may be connected to the first redistribution structure RDIS1 through the internal connection terminal 21 and the second redistribution pad 15. In some embodiments, the chip pad 19 of the chip 17 may be directly connected to the fifth redistribution via va5 without the internal connection terminal 21 and the second redistribution pad 15. Pads, as described herein, refer to a conductive component having at least one flat surface to which another conductive component at a higher or lower vertical level connects.

Referring to FIG. 3, a portion of the first redistribution structure RDIS1 is enlarged and described in more detail. The portion may represent, for example, a single redistribution line formed at a particular vertical level, to connect a component at a lower vertical level than the particular vertical level to a component at a higher vertical level than the particular vertical level.

In detail, a lower redistribution via hole va1 is formed in a lower redistribution insulating layer 1L. The lower redistribution insulating layer 1L may be the redistribution insulating structure r1, that is, any one of the redistribution insulating layers 1*a*, 1*b*, 1*c*, 1*d*, and 1*e*. A lower barrier seed layer bs1 may be formed on an inner wall of the lower redistribution via hole va1 and the lower redistribution insulating layer 1L. The lower barrier seed layer bs1 may be any one of the barrier seed layers bs1, bs2, bs3, bs4, and bs5.

The lower barrier seed layer bs1 may be a double layer including a barrier layer, e.g., a Ti layer, and a seed layer, e.g., a Cu layer. In some embodiments, the lower barrier seed layer bs1 may be a single layer including only a seed layer, e.g., a Cu layer.

A redistribution layer rd may be formed on the lower barrier seed layer bs1. In FIG. 3, the redistribution layer rd may include the redistribution via described above. The redistribution layer rd may be any one of the redistribution layers rd1, rd2, rd3, and rd4. An upper redistribution insulating layer 1H may be formed on the lower redistribution insulating layer 1L formed on both sides of the redistribution layer rd. The upper redistribution insulating layer 1H may be the redistribution insulating structure r1, that is, any one of the redistribution insulating layers 1*a*, 1*b*, 1*c*, 1*d*, and 1*e*. An upper redistribution via hole vah is formed in the upper redistribution insulating layer 1H formed on the redistribution layer rd.

In some embodiments, a barrier layer sf may be formed between side surfaces (or sidewalls) of the redistribution layer rd and the upper redistribution insulating layer 1H. In some embodiments, the barrier layer sf may be formed between an upper surface of the redistribution layer rd and the upper redistribution insulating layer 1H. The barrier layer sf may be any one of the barrier layers sf1, sf2, sf3, sf4, and sf5. The barrier layer is not formed, however, on the exposed portion of the redistribution layer rd.

The self-forming barrier layer sf may improve the mechanical and electrical reliability between the redistribution layer rd and the upper redistribution insulating layer 1H. The self-forming barrier layer sf may improve adhesion between the redistribution layer rd and the upper redistribution insulating layer 1H as well as reduce the diffusion of metal atoms in the redistribution layer rd to the upper redistribution insulating layer 1H.

FIGS. 4A to 4H are cross-sectional views for explaining a method of manufacturing the first redistribution structure of FIG. 3.

In detail, the same reference numerals in FIGS. 1 to 4H denote the same elements. The descriptions provided with reference to FIGS. 1 to 3 are briefly repeated or omitted in FIGS. 4A to 4H.

Figure 4A:
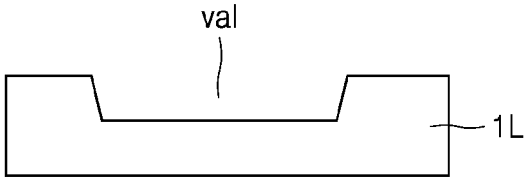
FIGS. 4A to 4H are cross-sectional views for explaining a method of manufacturing the first redistribution structure of FIG. 3.
Figure 4B:
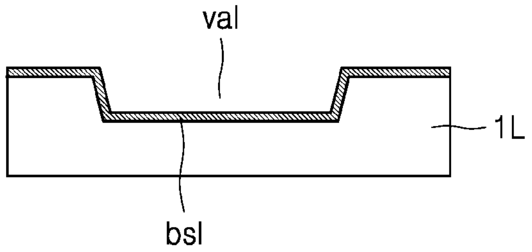

Referring to FIGS. 4A and 4B, the lower redistribution via hole va1 is formed in the lower redistribution insulating layer 1L through photolithography, as shown in FIG. 4A. A lower redistribution insulating layer 1L may be a PID layer.

As shown in FIG. 4B, the lower barrier seed layer bs1 is formed on the lower redistribution via hole va1 and the lower redistribution insulating layer 1L. In some embodiments, the lower barrier seed layer bs1 may be a double layer including a barrier layer, e.g., a Ti layer, and a seed layer, e.g., a Cu layer, the double layer being formed according to a sputtering method. The barrier layer (e.g., Ti layer) may be formed between the lower redistribution insulating layer 1L and the seed layer (e.g., Cu layer). In some embodiments, the lower barrier seed layer bs1 may be a single layer including a seed layer, e.g., a Cu layer, the single layer being formed according to a sputtering method.

Figure 4C:
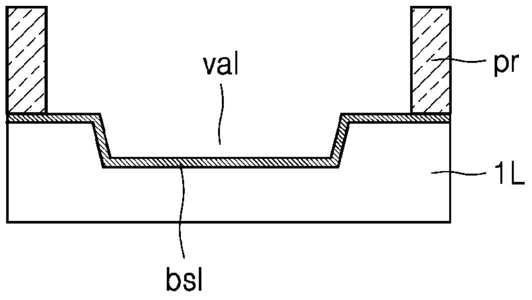
Figure 4D:
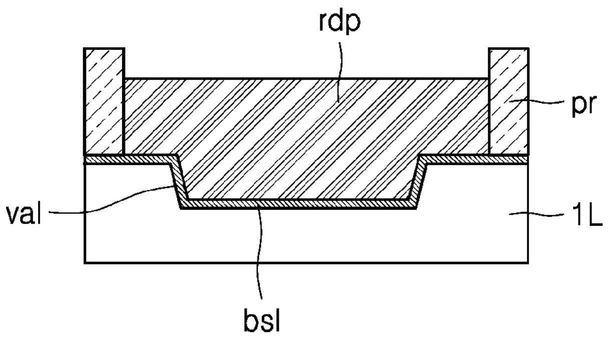

Referring to FIGS. 4C and 4D, as shown in FIG. 4C, a photoresist pattern pr is formed on the lower barrier seed layer bs1 through photolithography to expose an upper portion of the lower redistribution via hole va1.

As shown in FIG. 4D, a preliminary redistribution layer rdp is formed in the photoresist pattern pr formed on the lower barrier seed layer bs1, according to an electroplating method, for example. The preliminary redistribution layer rdp may include the same material as the redistribution layer rd, as described above.

Figure 4E:
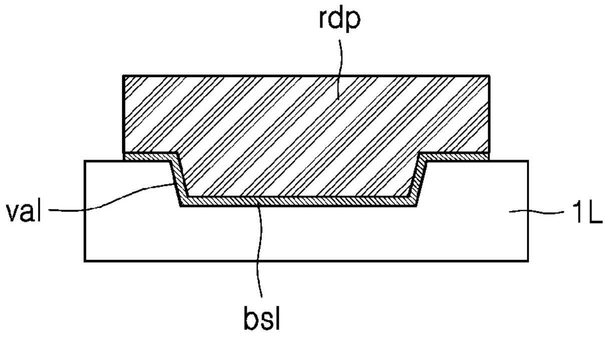
Figure 4F:
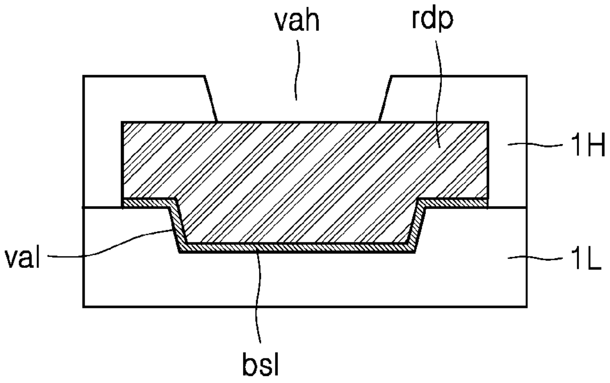

Referring to FIGS. 4E and 4F, as shown in FIG. 4E, the photoresist pattern pr is removed. A portion of the lower barrier seed layer bs1 is etched by using the preliminary redistribution layer rdp as an etch mask. In this case, side surfaces of the lower barrier seed layer bs1 and the preliminary redistribution layer rdp may be exposed.

As shown in FIG. 4F, the upper redistribution insulating layer 1H is formed on the lower redistribution insulating layer 1L to cover portions of the side surfaces and upper surfaces of the lower barrier seed layer bs1 and the preliminary redistribution layer rdp. After an upper redistribution insulation material layer is formed on the lower redistribution insulating layer 1L to cover both the lower barrier seed layer bs1 and the preliminary redistribution layer rdp, the upper redistribution via hole vah exposing the preliminary redistribution layer rdp is formed by etching the upper redistribution insulation material layer, for example, through photolithography.

In this case, portions of the side surfaces and the upper surfaces of the lower barrier seed layer bs1 and the preliminary redistribution layer rdp may contact the upper redistribution insulating layer 1H. A portion of the upper surface of the preliminary redistribution layer rdp may be exposed by the upper redistribution via hole vah.

Figure 4G:
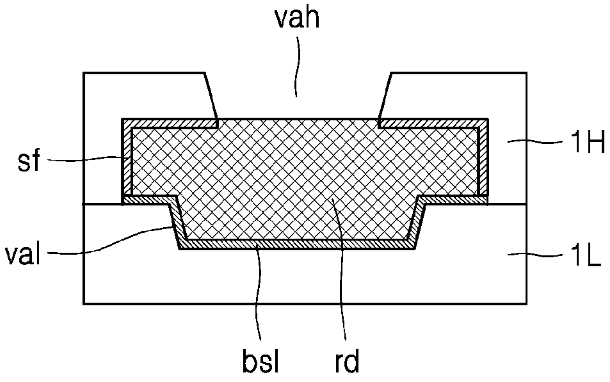
Figure 4H:
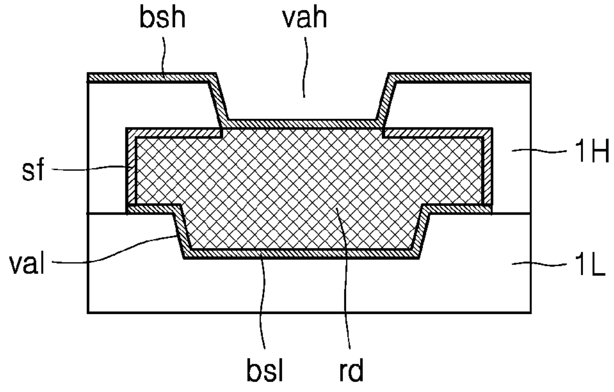

Referring to FIGS. 4G and 4H, as shown in FIG. 4G, the lower barrier seed layer bs1, the preliminary redistribution layer rdp (of FIG. 4F), the lower redistribution insulating layer 1L, and the upper redistribution insulating layer 1H react (for example, are cured) at a low temperature, e.g., a process temperature less than or equal to about 250° C.

Accordingly, the preliminary redistribution layer rdp (of FIG. 4F) may become the redistribution layer rd. In addition, the barrier layer sf may be formed between the side surfaces (or the sidewalls) and the upper surface of the redistribution layer rd and the upper redistribution insulating layer 1H. The barrier layer sf may be formed between the side surfaces (or the sidewalls) and the upper surface of the redistribution layer rd, which contact each other, and the upper redistribution insulating layer 1H.

As shown in FIG. 4H, an upper barrier seed layer bsh is formed in the upper redistribution via hole vah formed on the redistribution layer rd and on the upper redistribution insulating layer 1H. The upper barrier seed layer bsh may contact the redistribution layer rd. The upper barrier seed layer bsh may include the same material as the lower barrier seed layer bs1. Then, the processes shown in FIGS. 4C to 4G may be repeated.

Figure 5A:
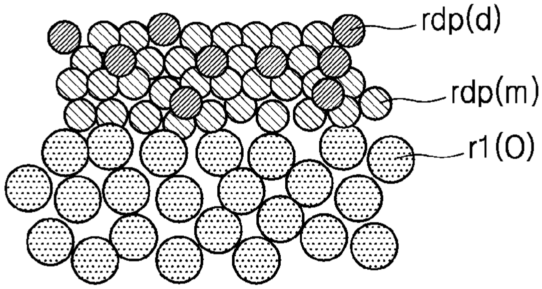
FIGS. 5A to 5C are schematic diagrams for explaining a process of forming a self-forming barrier layer of the first redistribution structure of FIGS. 4A to 4H.
Figure 5B:
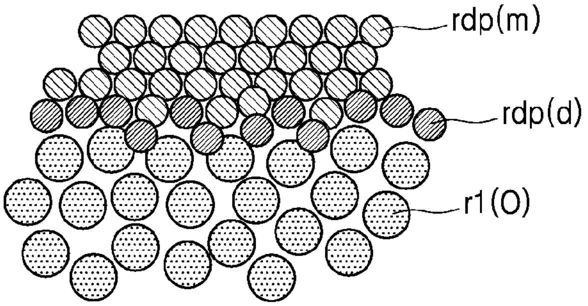
Figure 5C:
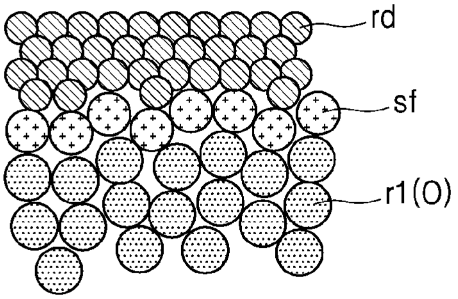

FIGS. 5A to 5C are schematic diagrams for explaining a process of forming a self-forming barrier layer of the first redistribution structure of FIGS. 4A to 4H.

In detail, the same reference numerals in FIGS. 1 to 5C denote the same elements. The descriptions provided with reference to FIGS. 4A to 4H are briefly repeated or omitted in FIGS. 5A to 5C.

Referring to FIG. 5A, as shown in FIGS. 4A to 4F, the preliminary redistribution layer rdp is formed on the redistribution insulating structure r1. The redistribution insulating structure r1 may be the lower redistribution insulating layer 1L or the upper redistribution insulating layer 1H. The redistribution insulating structure r1 may include oxygen (O) atoms.

The preliminary redistribution layer rdp may include base metal m and doping metal d. In some embodiments, the base metal m may be Cu. The doping metal d may include an atom optimized to form the self-forming barrier layer sf (of FIG. 5C) in a thermodynamic manner.

For example, the doping metal d may include an atom oxidized more easily than the base metal m, that is, the Cu atom. The doping metal d may have an activity coefficient greater than or equal to 1 and include an atom that may easily escape from a base metal atom arrangement, for example, a Cu atom arrangement.

The doping metal d may include an atom having low solubility, to which the doping metal dissolves in the base metal atom arrangement, for example, the Cu atom arrangement. The doping metal d may include an atom that does not form an intermetallic compound with the base metal m. The doping metal d may include an atom having a high melting point so that an electromigration characteristic of the doping metal d is better than that of a base metal atom, such as a Cu atom.

The doping metal d may include an atom with low resistivity to secure an electrical characteristic of a package. The doping metal d may select an optimized atom by considering an oxidation tendency, an activity coefficient, solubility, and formation of an intermetallic compound, and a thermodynamic variable of resistivity.

In some embodiments, the doping metal d may be Cr or Co when thermodynamic variables are considered. In some embodiments, the doping metal d may be included in the base metal m in a range from about 0.1 wt % to about 3 wt %.

In some embodiments, the doping metal d may be any one selected from among V, Fe, Mn, Ti, Mo, Ni, Zn, Mg, and Al when thermodynamic variables are considered. In some embodiments, the doping metal d may be included in the base metal m in a range from about 0.1 wt % to about 3 wt %.

Referring to FIGS. 5B and 5C, as shown in FIG. 4G above, the preliminary redistribution layer rdp and the redistribution insulating structure r1 may react (for example, may be cured) at a low temperature, e.g., a process temperature less than or equal to about 250° C.

In this case, as shown in FIG. 5B, the doping metal d may move to an interface of the redistribution insulating structure r1 (e.g., where the redistribution insulating structure r1 meets the preliminary redistribution layer rdp). Then, as shown in FIG. 5C, the doping metal d reacts with 0 atoms on the interface of the redistribution insulating structure r1, and thus, the barrier layer sf may be formed. The barrier layer sf may be, for example, a metal oxide. In this process, the preliminary redistribution layer rdp may become the redistribution layer rd.

Figure 6:
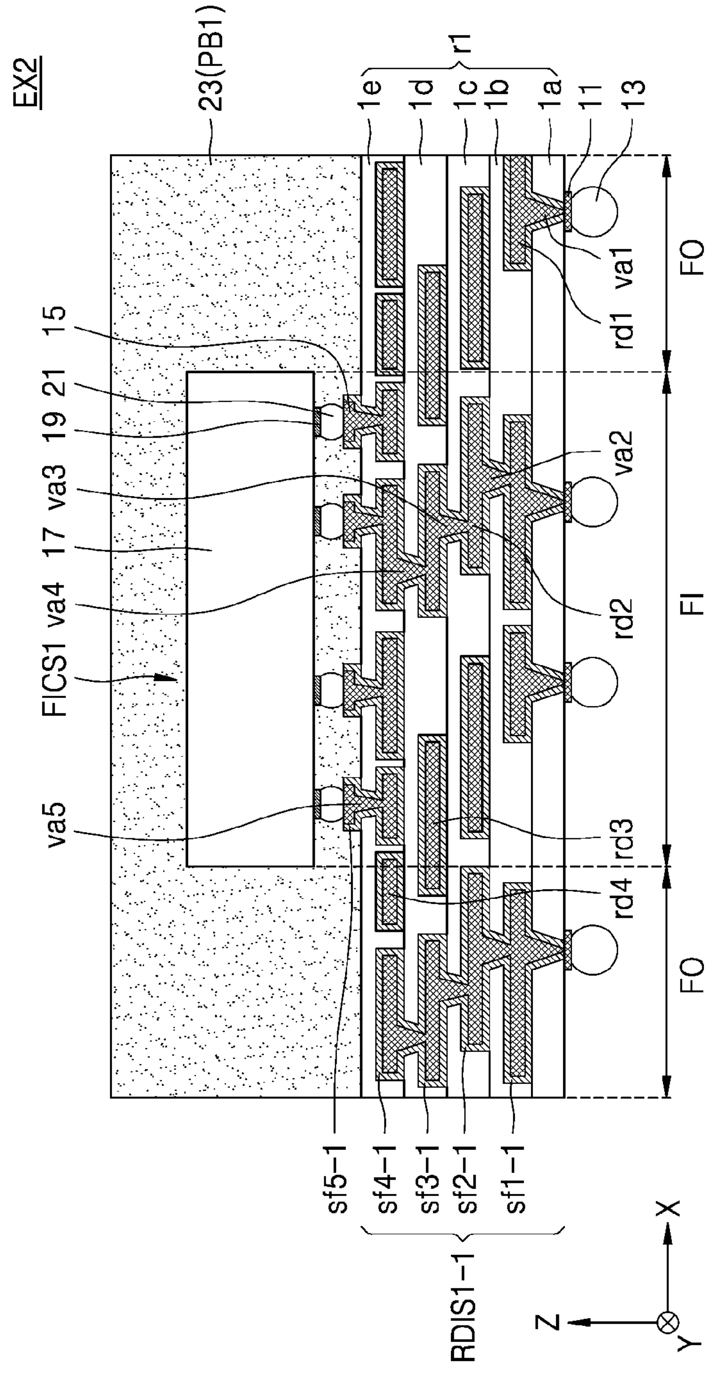
FIG. 6 is a cross-sectional view of a semiconductor package according to an embodiment.
Figure 7:
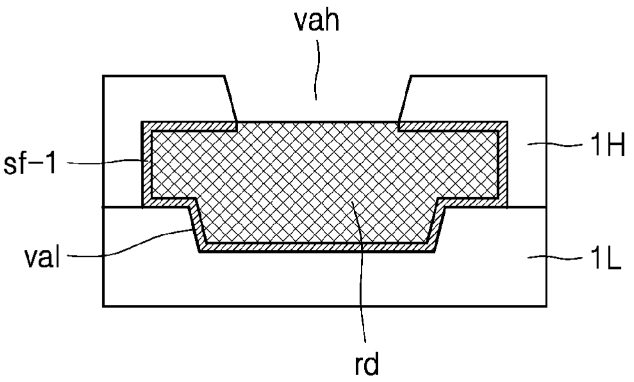
FIG. 7 is a partial enlarged view for explaining a first redistribution structure of FIG. 6.

FIG. 6 is a cross-sectional view of a semiconductor package according to an embodiment, and FIG. 7 is a partial enlarged view for explaining a first redistribution structure of FIG. 6.

In detail, when compared with the semiconductor package EX1 of FIGS. 1 to 3, a semiconductor package EX2 may be substantially the same as the semiconductor package EX1 except for self-forming barrier layers sf1-1, sf2-1, sf3-1, sf4-1, and sf5-1 formed on lower, side, and upper surfaces of the redistribution layers rd1, rd2, rd3, and rd4, the side surfaces of the redistribution vias va1, va2, va3, va4, and va5, and between the redistribution insulating layers 1*a*, 1*b*, 1*c*, 1*d*, and 1*e*. The same reference numerals in FIGS. 1 to 3, 6, and 7 denote the same elements. The descriptions provided with reference to FIGS. 1 to 3 are briefly repeated or omitted in FIGS. 6 and 7.

The semiconductor package EX2 may include a first redistribution structure RDIS1-1, the chip 17, and the encapsulation layer 23. The first redistribution structure RDIS1-1 may include the self-forming barrier layers sf1-1, sf2-1, sf3-1, sf4-1, and sf5-1.

When compared with FIGS. 1 to 3, the self-forming barrier layers sf1-1, sf2-1, sf3-1, sf4-1, and sf5-1 are formed on the lower surfaces of the redistribution layers rd1, rd2, rd3, and rd4, the side surfaces of the redistribution vias va1, va2, va3, va4, and va5, and between the redistribution insulating layers 1*a*, 1*b*, 1*c*, 1*d*, and 1*e*.

Referring to FIG. 7, a portion of the first redistribution structure RDIS1-1 is enlarged and described in more detail.

In detail, the lower redistribution via hole va1 is formed in the lower redistribution insulating layer 1L. The lower redistribution insulating layer 1L may be the redistribution insulating structure r1, for example, any one of the redistribution insulating layers 1*a*, 1*b*, 1*c*, 1*d*, and 1*e*.

Unlike the description above, the lower barrier seed layer (bs1 of FIG. 3) is not formed, and the self-forming barrier layer sf-1 may be formed on the inner wall of the lower redistribution via hole va1 and the lower redistribution insulating layer 1L. The self-forming barrier layer sf-1 may be any one of the self-forming barrier layers sf1-1, sf2-1, sf3-1, sf4-1, and sf5-1.

The redistribution layer rd may be formed on the self-forming barrier layer sf-1. The redistribution layer rd may be any one of the redistribution layers rd1, rd2, rd3, and rd4. The redistribution layer rd of FIG. 7 may include the redistribution via described above.

The upper redistribution insulating layer 1H may be formed on the lower redistribution insulating layer 1L formed on both sides of the redistribution layer rd. The upper redistribution insulating layer 1H may be the redistribution insulating structure r1, for example, any one of the redistribution insulating layers 1*a*, 1*b*, 1*c*, 1*d*, and 1*e*. The upper redistribution via hole vah is formed in the upper redistribution insulating layer 1H formed on the redistribution layer rd.

In some embodiments, the self-forming barrier layer sf-1 may be formed between the side surfaces (or sidewalls) of the redistribution layer rd and the upper redistribution insulating layer 1H. In some embodiments, the self-forming barrier layer sf-1 may be formed between the upper surface of the redistribution layer rd and the upper redistribution insulating layer 1H. The self-forming barrier layer sf-1 may be any one of the self-forming barrier layers sf1, sf2, sf3, sf4, and sf5.

The self-forming barrier layer sf-1 may improve the mechanical and electrical reliability between the redistribution layer rd and the upper redistribution insulating layer 1H and the lower redistribution insulating layer 1L. The self-forming barrier layer sf-1 may improve adhesion between the redistribution layer rd and the upper redistribution insulating layer 1H and the lower redistribution insulating layer 1L as well as reduce the diffusion of metal atoms in the redistribution layer rd to the upper redistribution insulating layer 1H and the lower redistribution insulating layer 1L.

FIGS. 8A to 8H are cross-sectional views for explaining a method of manufacturing the first redistribution structure of FIG. 7.

In detail, the same reference numerals in FIGS. 6 to 8H denote the same elements. The descriptions provided with reference to FIGS. 6 and 7 are briefly repeated or omitted in FIGS. 8A to 8H.

Figure 8A:
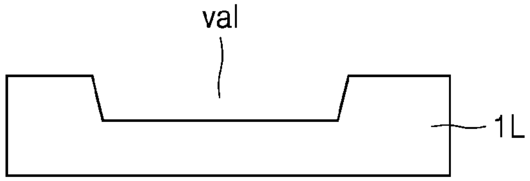
FIGS. 8A to 8H are cross-sectional views for explaining a method of manufacturing the first redistribution structure of FIG. 7.
Figure 8B:
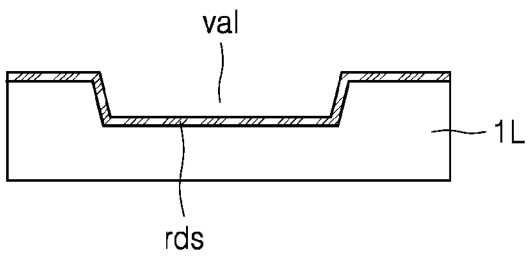

Referring to FIGS. 8A and 8B, the lower redistribution via hole va1 is formed in the lower redistribution insulating layer 1L through photolithography, as shown in FIG. 8A. The lower redistribution insulating layer 1L may be a PID layer.

As shown in FIG. 8B, a lower redistribution seed layer rds is formed in the lower redistribution via hole va1 and on the lower redistribution insulating layer 1L. In some embodiments, the lower redistribution seed layer rds may include the same material as the redistribution layer rd described above. The lower redistribution seed layer rds may be formed according to a sputtering method. Thus, the lower redistribution seed layer rds (e.g., that does not include a barrier layer such as Ti) may be used rather than a lower barrier seed layer bs1 described in FIGS. 4B-4H.

Figure 8C:
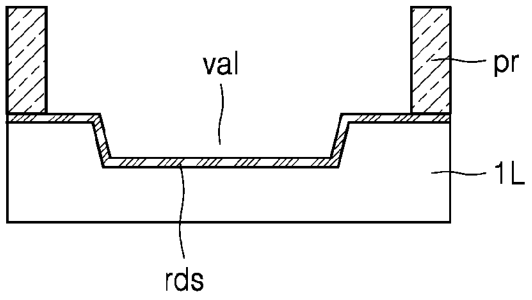
Figure 8D:
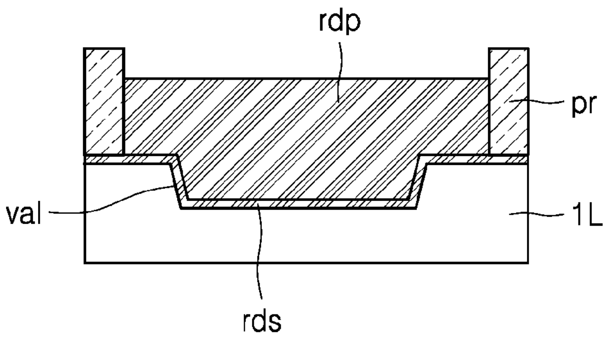

Referring to FIGS. 8C and 8D, as shown in FIG. 8C, the photoresist pattern pr is formed on the lower redistribution seed layer rds through photolithography to expose an upper portion of the lower redistribution via hole va1.

As shown in FIG. 8D, the preliminary redistribution layer rdp is formed in the photoresist pattern pr formed on the lower redistribution seed layer rds, according to an electroplating method. The preliminary redistribution layer rdp may include or be formed of the same material as the redistribution layer rd described above.

Figure 8E:
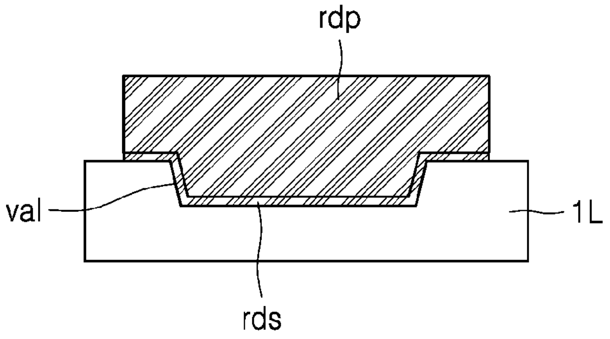
Figure 8F:
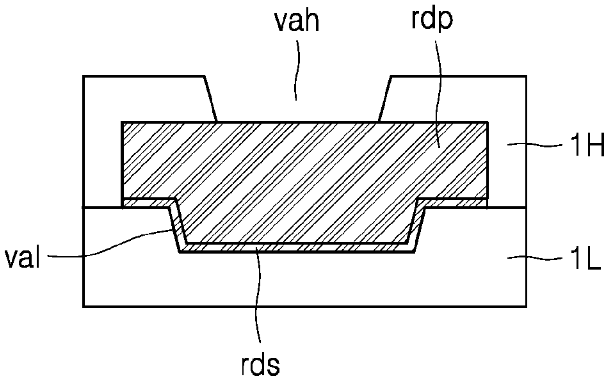

Referring to FIGS. 8E and 8F, as shown in FIG. 8E, the photoresist pattern pr is removed. A portion of the lower redistribution seed layer rds is etched by using the preliminary redistribution layer rdp as an etch mask. In this case, side surfaces of the lower redistribution seed layer rds and the preliminary redistribution layer rdp may be exposed.

As shown in FIG. 8F, the upper redistribution insulating layer 1H is formed on the lower redistribution insulating layer 1L to cover portions of the side surfaces and upper surfaces of the lower barrier seed layer bs1 and the preliminary redistribution layer rdp. After an upper redistribution insulation material layer is formed on the lower redistribution insulating layer 1L to cover both the lower redistribution seed layer rds and the preliminary redistribution layer rdp, the upper redistribution via hole vah exposing the preliminary redistribution layer rdp is formed by etching the upper redistribution insulation material layer through photolithography.

In this case, the upper redistribution insulating layer 1H and the lower redistribution insulating layer 1L may contact lower and side surfaces of the lower redistribution seed layer rds and portions of the side and upper surfaces of the preliminary redistribution layer rdp. A portion of the upper surface of the preliminary redistribution layer rdp may be exposed by the upper redistribution via hole vah.

Figure 8G:
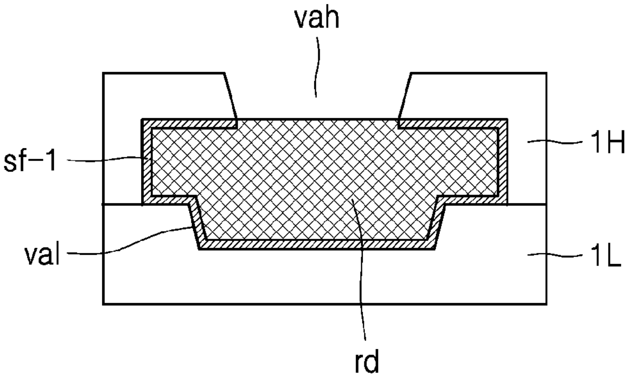
Figure 8H:
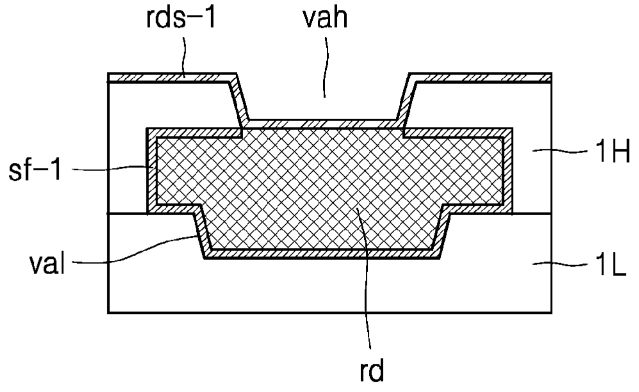

Referring to FIGS. 8G and 8H, as shown in FIG. 8G, the lower redistribution seed layer (rds of FIG. 8F), the preliminary redistribution layer (rdp of FIG. 8F), the lower redistribution insulating layer 1L, and the upper redistribution insulating layer 1H react (that is, are cured) at a low temperature, e.g., at a process temperature less than or equal to about 250° C.

Accordingly, the preliminary redistribution layer (rdp of FIG. 8F) may become the redistribution layer rd. In addition, the self-forming barrier layer sf-1 may be formed between the lower surface, the side surfaces (or the sidewalls), and the upper surface of the redistribution layer rd and the upper redistribution insulating layer 1H and the lower redistribution insulating layer 1L. The self-forming barrier layer sf-1 may be formed between the lower surface, the side surfaces (or the sidewalls), and the upper surface of the redistribution layer rd, which contact each other, and the upper redistribution insulating layer 1H and the lower redistribution insulating layer 1L. A process of forming the self-forming barrier layer sf-1 may be the same as that described above with reference to FIGS. 5A to 5C.

As shown in FIG. 8H, an upper redistribution seed layer rds-1 is formed in the upper redistribution via hole vah formed in the redistribution layer rd and on the upper redistribution insulating layer 1H. The upper redistribution seed layer rds-1 may contact the redistribution layer rd. The upper redistribution seed layer rds-1 may include the same material as the lower redistribution seed layer rds. Then, the processes shown in FIGS. 8C to 8G may be repeated. As a result, in sections where an upper redistribution layer abuts a lower redistribution layer, because the interface includes the same materials from each redistribution layer, a continuous material may be formed at the interface (e.g., rather than a different material such as Ti).

Figure 9:
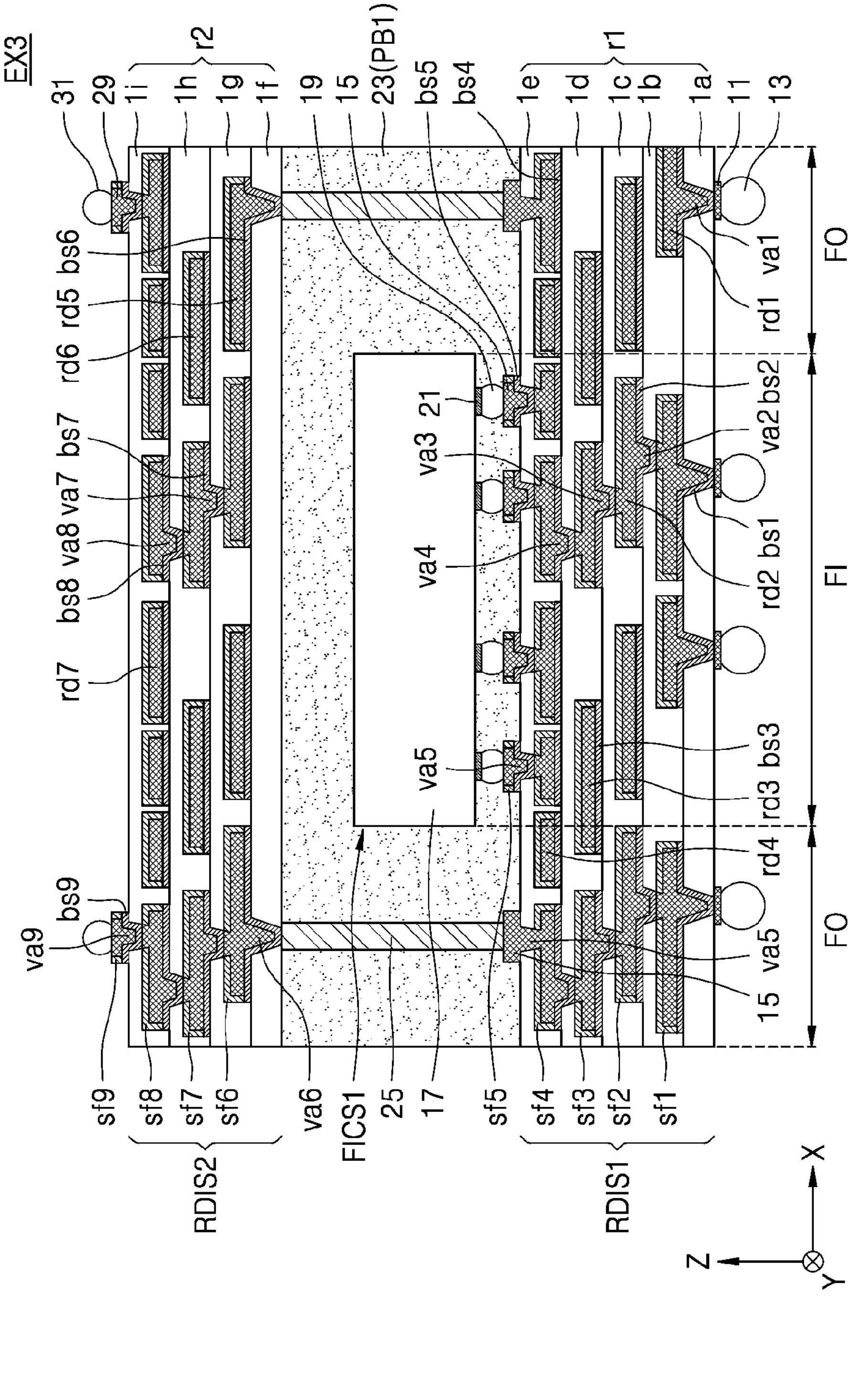
FIG. 9 is a cross-sectional view of a semiconductor package according to an embodiment.

FIG. 9 is a cross-sectional view of a semiconductor package according to an embodiment.

In detail, when compared with the semiconductor package EX1 of FIGS. 1 to 3, a semiconductor package EX3 may be substantially the same as the semiconductor package EX1 except that a body wiring structure 25 is formed inside the encapsulation layer 23 and a second redistribution structure RDIS2 is further arranged on the encapsulation layer 23 and the body wiring structure 25. The same reference numerals in FIGS. 1 to 3 and 9 denote the same elements. The descriptions provided with reference to FIGS. 1 to 3 are briefly repeated or omitted in FIG. 9.

The semiconductor package EX3 may include the first redistribution structure RDIS1, the chip 17, the encapsulation layer 23, the body wiring structure 25, and the second redistribution structure RDIS2. The redistribution vias va1, va2, va3, va4, and va5 forming the first redistribution structure RDIS1 may include the redistribution via va5 for body connection which is arranged on an uppermost portion of the first redistribution structure RDIS1. The second redistribution pad 15 for body connection may be formed on the redistribution via va5 for body connection.

The encapsulation layer 23 may form the package body PB1. In the encapsulation layer 23 in the fan-out areas FO, the body wiring structure 25 connected to the second redistribution pad 15 for body connection may be formed. The body wiring structure 25 may include or may be a metal post layer, e.g., a Cu post layer.

The second redistribution structure RDIS2 may be arranged on the encapsulation layer 23 and the body wiring structure 25. The second redistribution structure RDIS2 may be arranged on an upper surface of the package body PB1 and an upper surface of the fan-in chip structure FICS1. The second redistribution structure RDIS2 may have substantially the same structure as the first redistribution structure RDIS1.

The second redistribution structure RDIS2 may be electrically connected to the first redistribution structure RDIS1 through the body wiring structure 25. The second redistribution structure RDIS2 may extend to the fan-out areas FO and may be electrically connected to the body wiring structure 25. The second redistribution structure RDIS2 may be directly connected to the body wiring structure 25. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

The second redistribution structure RDIS2 may include a plurality of redistribution layers rd5, rd6, and rd7 stacked in the vertical direction (the Z direction). The redistribution layers rd5, rd6, and rd7 may include fifth to seventh redistribution layers rd5, rd6, and rd7.

The second redistribution structure RDIS2 may include a plurality of redistribution insulating layers 1*f*, 1g, 1*h*, and 1*i* that insulate the redistribution layers rd5, rd6, and rd7 from each other and a plurality of redistribution vias va6, va7, va8, and va9 that electrically connect the redistribution layers rd5, rd6, and rd7 to each other through the redistribution insulating layers 1*f*, 1g, 1*h*, and 1*i*.

The redistribution insulating layers 1*f*, 1g, 1*h*, and 1*i* may constitute a redistribution insulating structure r2. The redistribution insulating layers 1*f*, 1g, 1*h*, and 1*i* may each be a polymer insulating layer including oxygen atoms. The redistribution insulating layers 1*f*, 1g, 1*h*, and 1*i* may be a PID layer. The redistribution insulating layers 1*f*, 1g, 1*h*, and 1*i* may include a sixth redistribution insulating layer 1*f*, a seventh redistribution insulating layer 1g, an eighth redistribution insulating layer 1*h*, and a ninth redistribution insulating layer 1*i*.

The redistribution layers rd5, rd6, and rd7 may include the fifth redistribution layer rd5, the sixth redistribution layer rd6, and the seventh redistribution layer rd7. In the present embodiment, there are three redistribution layers rd5, rd6, and rd7, but there may be at least two redistribution layers. The redistribution layers rd5, rd6, and rd7 may respectively correspond to the redistribution layers rd1, rd2, rd3, and rd4 of FIG. 1 described above. The redistribution layers rd5, rd6, and rd7 may include the same materials as the redistribution layers rd1, rd2, rd3, and rd4 of FIG. 1 described above.

The second redistribution structure RDIS2 includes a plurality of barrier seed layers bs6, bs7, bs8, and bs9 formed on lower surfaces of the redistribution layers rd5, rd6, and rd7, side surfaces and lower surfaces of the redistribution vias va6, va7, va8, and va9 and between the redistribution insulating layers 1*f*, 1g, 1*h*, and 1*i*, and a plurality of self-forming barrier layers sf6, sf7, sf8, and sf9 formed on side surfaces of the redistribution layers rd5, rd6, and rd7 and between the redistribution insulating layers 1*f*, 1g, 1*h*, and 1*i*.

The barrier seed layers bs6, bs7, bs8, and bs9 may include the same materials as the barrier seed layers bs1, bs2, bs3, bs4, and bs5 of FIG. 1. The self-forming barrier layers sf6, sf7, sf8, and sf9 may include the same materials as the self-forming barrier layers sf1, sf2, sf3, sf4, and sf5 of FIG. 1.

The redistribution vias va6, va7, va8, and va9 may include sixth to ninth redistribution vias va6, va7, va8, and va9. The sixth redistribution via va6 arranged on a lowermost portion among the redistribution vias va6, va7, va8, and va9 may be a body connection via.

The redistribution vias va6, va7, va8, and va9 may respectively correspond to the redistribution vias va1, va2, va3, va4, and va5 of FIG. 1 described above. The redistribution vias va6, va7, va8, and va9 may respectively include the same materials as the redistribution layers rd5, rd6, and rd7. The redistribution vias va6, va7, va8, and va9 may include the same materials as the redistribution vias va1, va2, va3, va4, and va5 of FIG. 1 described above.

The first redistribution structure RDIS1 may be referred to as a lower redistribution structure. The second redistribution structure RDIS2 may be referred to as an upper redistribution structure. The ninth redistribution via va9 arranged on an uppermost portion among the redistribution vias va6, va7, va8, and va9 may be a redistribution via for external connection. The ninth redistribution via va9 may be connected to a third redistribution pad 29, and the third redistribution pad 29 may be connected to a second external connection terminal 31.

The semiconductor package EX3 may include the second redistribution structure RDIS2 including the self-forming barrier layers sf6, sf7, sf8, and sf9. Accordingly, the semiconductor package EX3 may improve the mechanical and electrical reliability between the redistribution layers rd5, rd6, and rd7 and the redistribution insulating layers 1*f*, 1*g*, 1*h*, and 1*i* in the second redistribution structure RDIS2.

Figure 10:
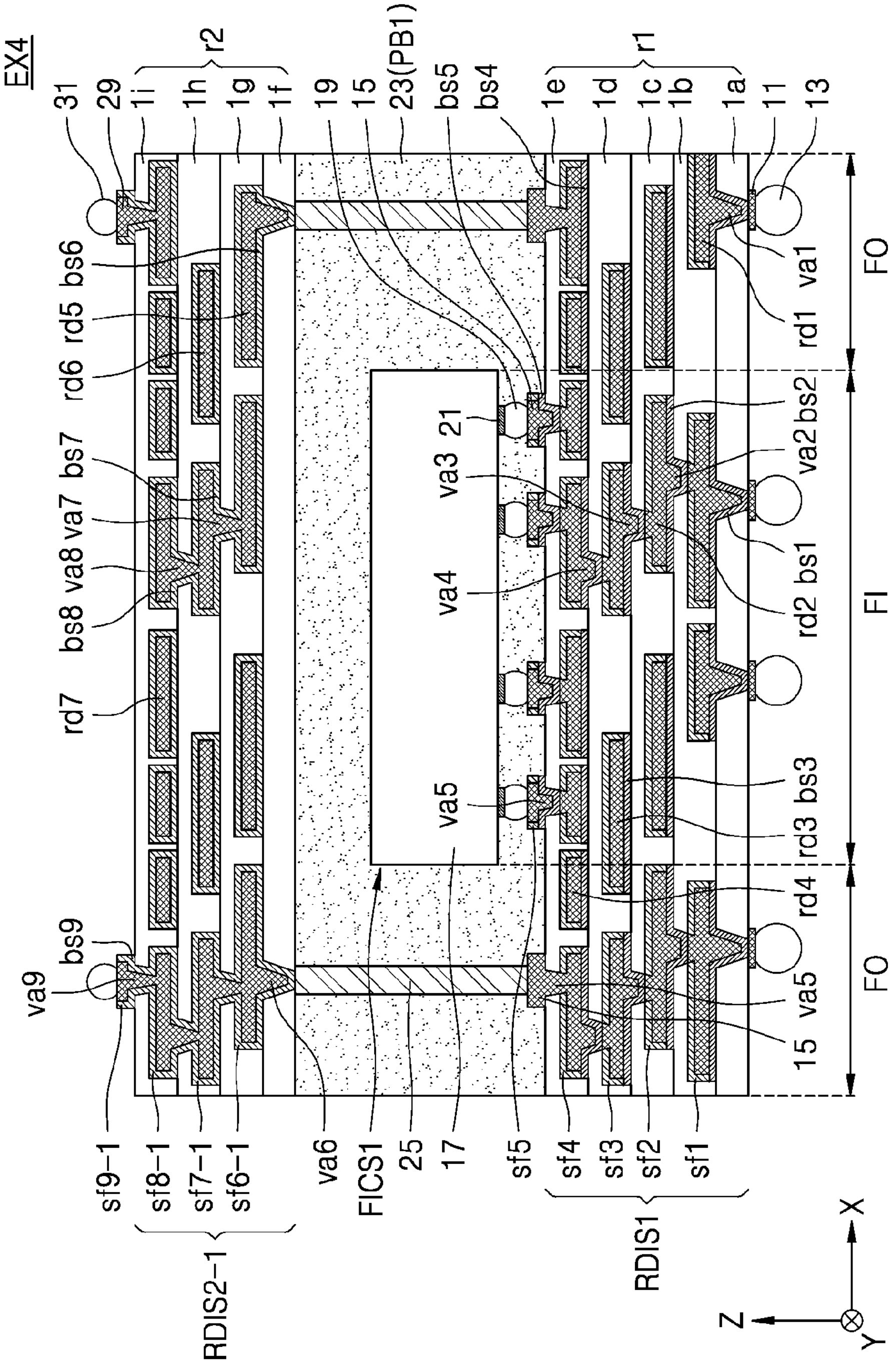
FIG. 10 is a cross-sectional view of a semiconductor package according to an embodiment.

FIG. 10 is a cross-sectional view of a semiconductor package according to an embodiment.

In detail, when compared with the semiconductor package EX3 of FIG. 9, a semiconductor package EX4 may be substantially the same as the semiconductor package EX3 except that a second redistribution structure RDIS2-1 is further arranged on the encapsulation layer 23 and the body wiring structure 25. The same reference numerals in FIGS. 9 and 10 denote the same elements. The descriptions provided with reference to FIG. 9 are briefly repeated or omitted in FIG. 10.

The semiconductor package EX4 may include the first redistribution structure RDIS1, the chip 17, the encapsulation layer 23, the body wiring structure 25, and the second redistribution structure RDIS2-1. The second redistribution structure RDIS2-1 may have substantially the same structure as the first redistribution structure RDIS1-1 of FIG. 6.

The second redistribution structure RDIS2-1 may be arranged on the encapsulation layer 23 and the body wiring structure 25. The second redistribution structure RDIS2-1 may be arranged on the upper surface of the package body PB1 and the upper surface of the fan-in chip structure FICS1. The second redistribution structure RDIS2-1 may be electrically connected to the first redistribution structure RDIS1 through the body wiring structure 25.

The second redistribution structure RDIS2-1 may include the redistribution layers rd5, rd6, and rd7 stacked in the vertical direction (the Z direction). The redistribution layers rd5, rd6, and rd7 may include the fifth to seventh redistribution layers rd5, rd6, and rd7.

The second redistribution structure RDIS2-1 may include the redistribution insulating layers 1*f*, 1*g*, 1*h*, and 1*i* that insulate the redistribution layers rd5, rd6, and rd7 from each other and the redistribution vias va6, va7, va8, and va9 that electrically connect the redistribution layers rd5, rd6, and rd7 to each other through the redistribution insulating layers 1*f*, 1*g*, 1*h*, and 1*i*.

The redistribution insulating layers 1*f*, 1*g*, 1*h*, and 1*i* may constitute the redistribution insulating structure r2. The redistribution insulating layers 1*f*, 1*g*, 1*h*, and 1*i* may each be a polymer insulating layer including oxygen atoms. The redistribution insulating layers 1*f*, 1*g*, 1*h*, and 1*i* may each be a PID layer. The redistribution insulating layers 1*f*, 1*g*, 1*h*, and 1*i* may include the sixth redistribution insulating layer 1*f*, the seventh redistribution insulating layer 1*g*, the eighth redistribution insulating layer 1*h*, and the ninth redistribution insulating layer 1*i*.

The redistribution layers rd5, rd6, and rd7 may include the fifth redistribution layer rd5, the sixth redistribution layer rd6, and the seventh redistribution layer rd7. In the present embodiment, there are three redistribution layers rd5, rd6, and rd7, but there may be at least two redistribution layers. The redistribution layers rd5, rd6, and rd7 may respectively correspond to the redistribution layers rd1, rd2, rd3, and rd4 of FIG. 1 described above. The redistribution layers rd5, rd6, and rd7 may include the same materials as the redistribution layers rd1, rd2, rd3, and rd4 of FIG. 1 described above.

The second redistribution structure RDIS2-1 includes a plurality of self-forming barrier layers sf6-1, sf7-1, sf-1, and sf9-1 formed between lower surfaces, side surfaces, and upper surfaces of the redistribution layers rd5, rd6, and rd7 and side surfaces of the redistribution vias va6, va7, va8, and va9 and the redistribution insulating layers 1*f*, 1*g*, 1*h*, and 1*i*. The self-forming barrier layers sf6-1, sf7-1, sf8-1, and sf9-1 may include the same materials as the self-forming barrier layers sf1, sf2, sf3, sf4, and sf5 of FIG. 6.

The redistribution vias va6, va7, va8, and va9 may include the sixth to ninth redistribution vias va6, va7, va8, and va9. The sixth redistribution via va6 arranged on the lowermost portion among the redistribution vias va6, va7, va8, and va9 may be a body connection via.

The redistribution vias va6, va7, va8, and va9 may respectively correspond to the redistribution vias va1, va2, va3, va4, and va5 of FIG. 1 described above. The redistribution vias va6, va7, va8, and va9 may include the same materials as the redistribution layers rd5, rd6, and rd7. The redistribution vias va6, va7, va8, and va9 may include the same materials as the redistribution vias va1, va2, va3, va4, and va5 of FIG. 6 described above.

The ninth redistribution via va9 arranged on the uppermost portion among the redistribution vias va6, va7, va8, and va9 may be a redistribution via for external connection. The ninth redistribution via va9 may be connected to the third redistribution pad 29, and the third redistribution pad 29 may be connected to the second external connection terminal 31.

The semiconductor package EX4 may include the second redistribution structure RDIS2-1 including the self-forming barrier layers sf6-1, sf7-1, sf8-1, and sf9-1. Accordingly, the semiconductor package EX4 may improve the mechanical and electrical reliability between the redistribution layers rd5, rd6, and rd7 and the redistribution insulating layers 1*f*, 1*g*, 1*h*, and 1*i* in the second redistribution structure RDIS2-1.

Figure 11:
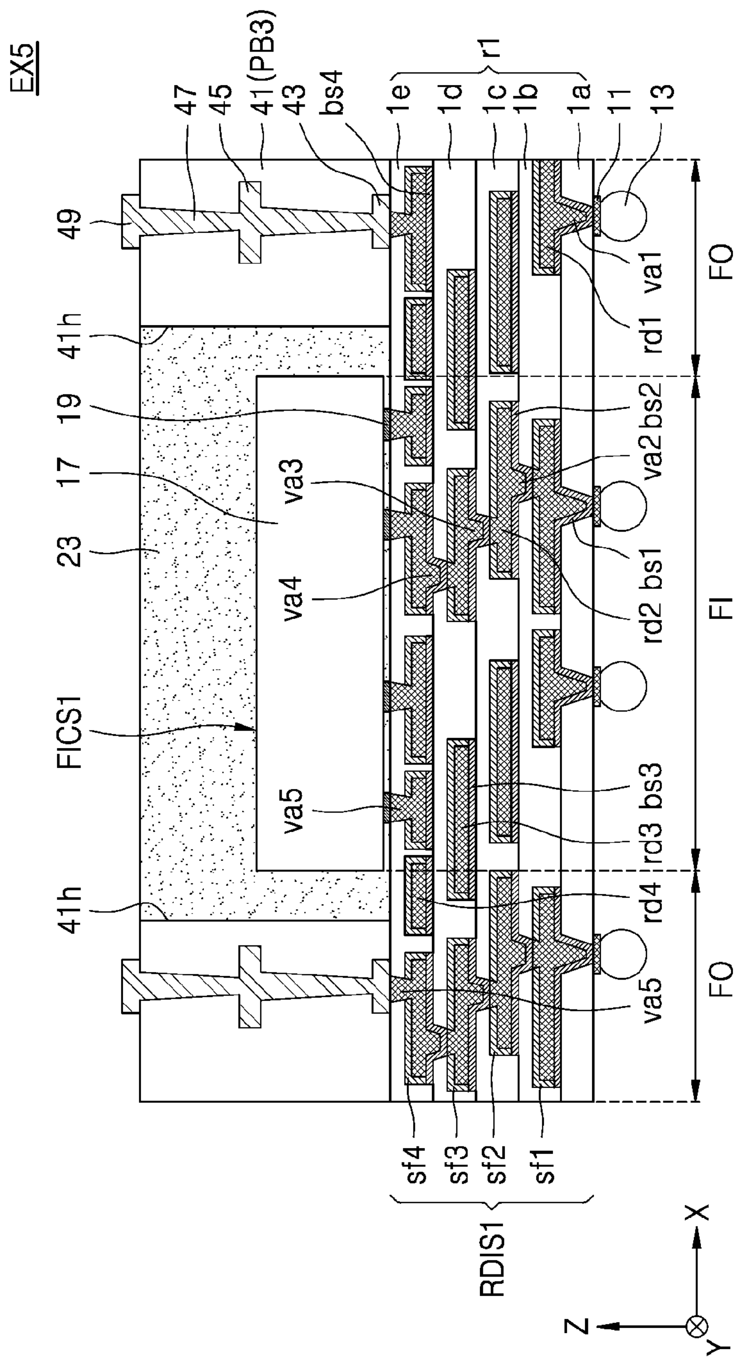
FIG. 11 is a cross-sectional view of a semiconductor package according to an embodiment.

FIG. 11 is a cross-sectional view of a semiconductor package according to an embodiment.

In detail, when compared with the semiconductor package EX1 of FIGS. 1 to 3, a semiconductor package EX5 may be substantially the same as the semiconductor package EX1 except that a package body PB3 includes a wiring substrate 41 and body wiring structures 45 and 47 are arranged in the wiring substrate 41. The same reference numerals in FIGS. 1 to 3 and 11 denote the same elements. The descriptions provided with reference to FIGS. 1 to 3 are briefly repeated or omitted in FIG. 11.

The semiconductor package EX5 may include the first redistribution structure RDIS1, the chip 17, the wiring substrate 41, the encapsulation layer 23, and the body wiring structures 45 and 47. Because the first redistribution structure RDIS1 is described above, the description thereof is omitted. The semiconductor package EX5 may include the wiring substrate 41 including the fan-in area FI, which corresponds to a body through hole 41*h* arranged in the wiring substrate 41, and the fan-out areas FO located on both sides of the fan-in area FI. The wiring substrate 41 may be the package body PB3. The wiring substrate 41 may include the body through hole 41*h* located in an internal area of the wiring substrate 41.

The fan-out areas FO may surround the fan-in area FI in a plan view. The semiconductor package EX5 may include a fan-in chip structure FICS1 arranged in the body through hole 41*h*. The fan-in chip structure FICS1 may be embedded in the body through hole 41*h*. The wiring substrate 41 may be an insulative substrate. The wiring substrate 41 may be a printed circuit board. The wiring substrate 41 may be referred to as a frame substrate. The semiconductor package EX5 may be of a Fan Out Panel Level Package (FOPLP) type. Alternatively, instead of a wiring substrate, a semiconductor substrate may be used for the package body PB3.

The wiring substrate 41 may include or be formed of at least one material selected from among phenol resin, epoxy resin, and polyimide. For example, the wiring substrate 41 may include at least one material selected from among Frame Retardant 4 (FR4), tetrafunctional epoxy, polyphenylene ether, epoxy/polyphenylene oxide, Bismaleimide Triazine (BT), thermount, cyanate ester, polyimide, and a liquid crystal polymer.

The chip 17 may be embedded in the body through hole 41*h* and also sealed by the encapsulation layer 23. In the wiring substrate 41, the body wiring structures 45 and 47 electrically connected to the first redistribution structure RDIS1 may be formed.

The body wiring structures 45 and 47 may include body wiring layers 45 formed in the wiring substrate 41 and a body via 47 connecting the body wiring layers 45 to each other. The body wiring structures 45 and 47 may be electrically connected to body wiring pads 43 and 49. The body wiring pads 43 and 49 may include a lower body wiring pad 43 arranged on a lower portion of the wiring substrate 41 and an upper body wiring pad 49 arranged on an upper portion of the wiring substrate 41.

The body wiring layer 45, the body via 47, and the body wiring pads 43 and 49 may each include or be a metal layer. For example, the body wiring layer 45 and the body wiring pads 43 and 49 may each include or may be Electrolytically Deposited (ED) copper foil, Rolled-Annealed (RA) copper foil, stainless steel foil, aluminum foil, ultra-thin copper foil, sputtered copper, copper alloys, or the like. The body via 47 may include, for example, Cu, Ni, stainless steel, or beryllium copper.

Figure 12:
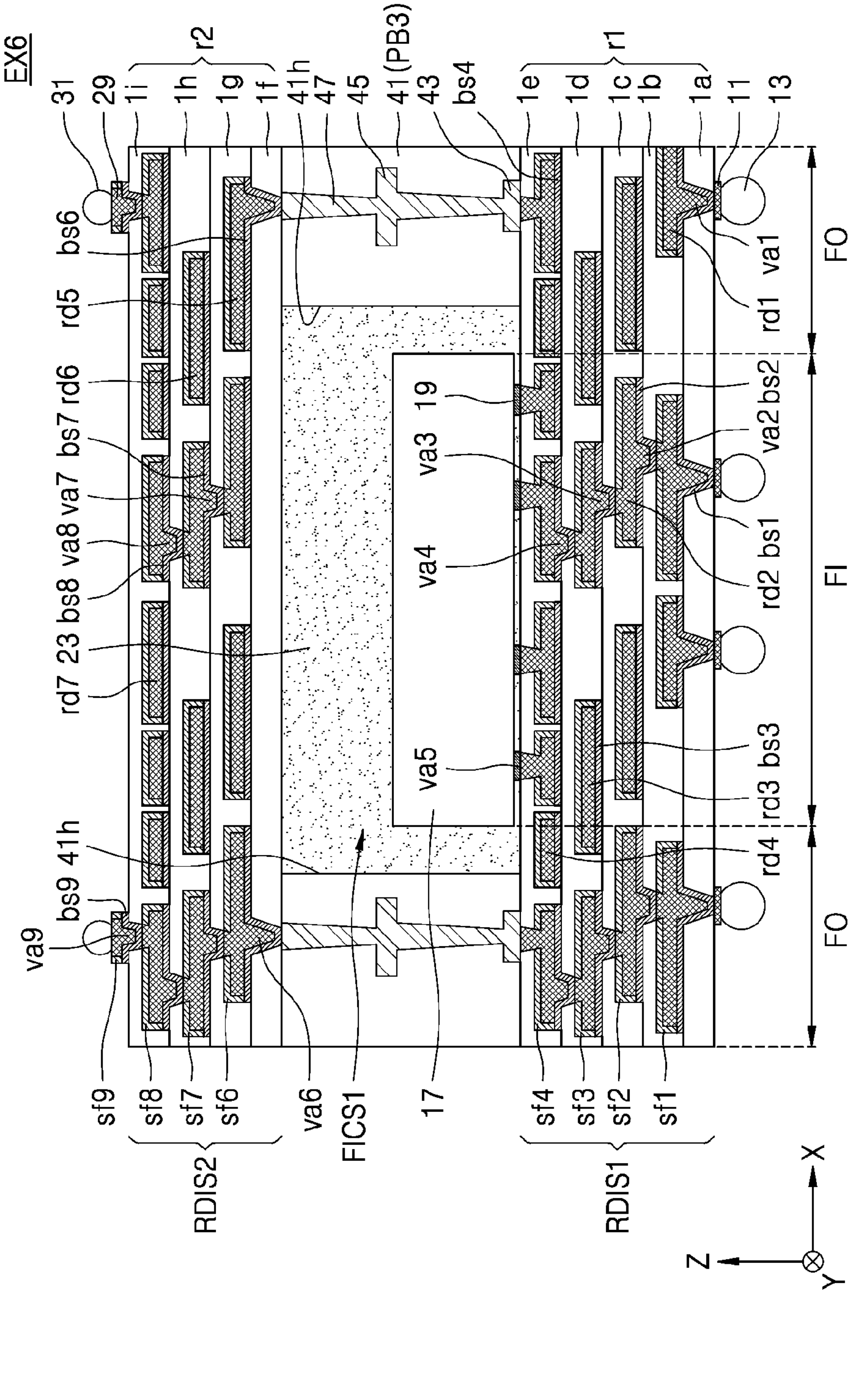
FIG. 12 is a cross-sectional view of a semiconductor package according to an embodiment.

FIG. 12 is a cross-sectional view of a semiconductor package according to an embodiment.

In detail, when compared with the semiconductor package EX5 of FIG. 11, a semiconductor package EX6 may be substantially the same as the semiconductor package EX5 except for the second redistribution structure RDIS2. The second redistribution structure RDIS2 of the semiconductor package EX6 may be the same as that described with reference to FIG. 9. The same reference numerals in FIGS. 9 to 11 and 12 denote the same elements. The descriptions provided with reference to FIGS. 9 to 11 are briefly repeated or omitted in FIG. 12.

The semiconductor package EX6 may include the first redistribution structure RDIS1, the chip 17, the wiring substrate 41, the encapsulation layer 23, the body wiring structures 45 and 47, and the second redistribution structure RDIS2. The second redistribution structure RDIS2 may have substantially the same structure as the first redistribution structure RDIS1.

The second redistribution structure RDIS2 may be arranged on an upper surface of the package body PB3 and the upper surface of the encapsulation layer 23. The second redistribution structure RDIS2 may extend to the fan-out areas FO and may be electrically connected to the body wiring structures 45 and 47. Unlike the illustration of FIG. 12, the second redistribution structure RDIS2 may be directly connected to the body wiring structures 45 and 47 without body wiring pads.

The sixth redistribution via va6 arranged on the lowermost portion among the redistribution vias va6, va7, va8, and va9 may be a body connection via. The sixth redistribution via va6 may be connected to the body wiring structures 45 and 47.

The ninth redistribution via va9 arranged on an uppermost portion among the redistribution vias va6, va7, va8, and va9 may be a redistribution via for external connection. The ninth redistribution via va9 may be connected to a third redistribution pad 29, and the third redistribution pad 29 may be connected to a second external connection terminal 31.

Figure 13:
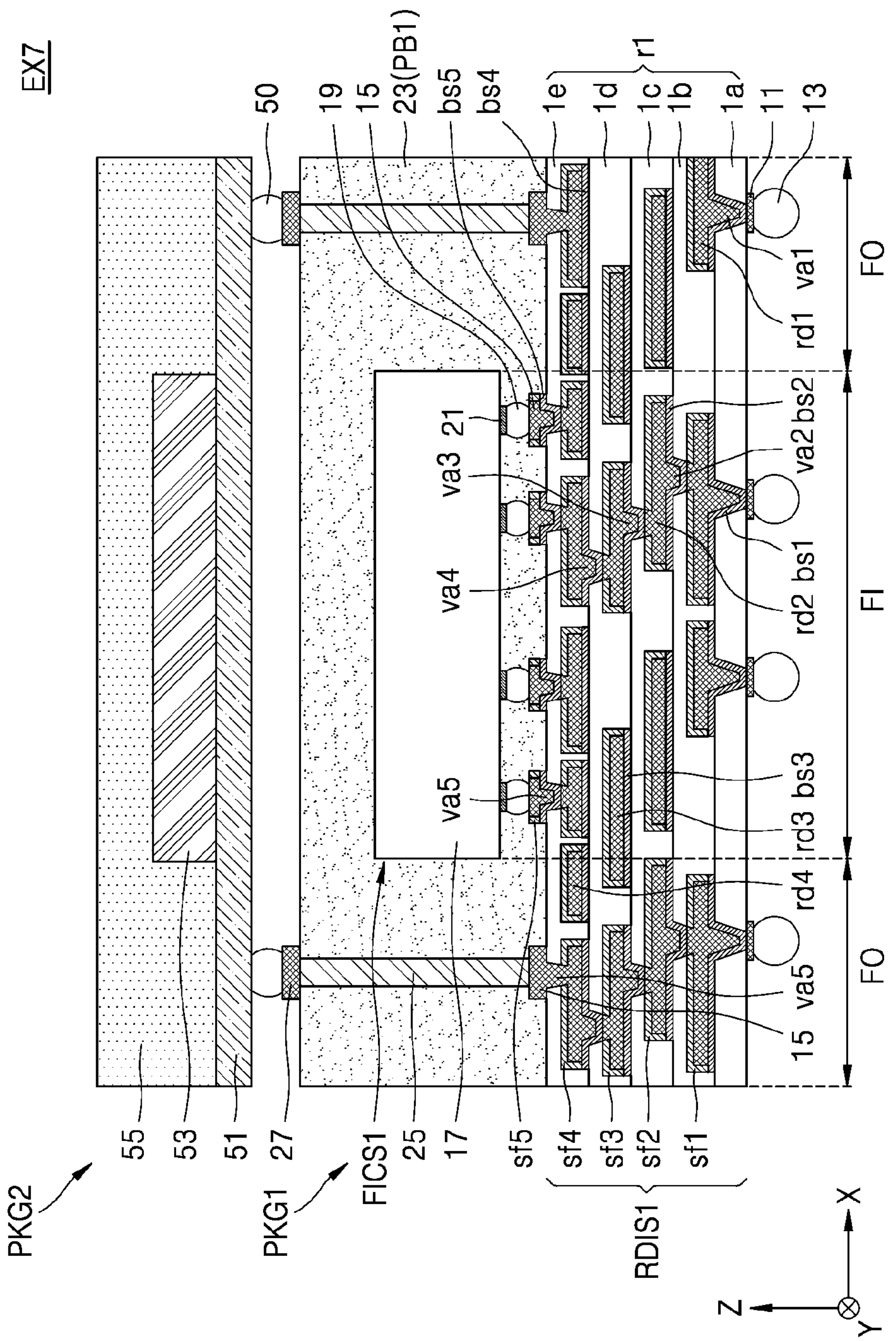
FIG. 13 is a cross-sectional view of a semiconductor package according to an embodiment.

FIG. 13 is a cross-sectional view of a semiconductor package according to an embodiment.

In detail, a semiconductor package EX7 may be the same as the semiconductor package EX3 except that the upper package PKG2 is further stacked on the encapsulation layer 23 and the body wiring structure 25 without the second redistribution structure RDIS2 in the semiconductor package EX7. The descriptions provided with reference to FIG. 9 are briefly repeated or omitted in FIG. 13. Here, a structure in which the second redistribution structure RDIS2 in the semiconductor package EX3 of FIG. 9 is not arranged is referred to as a lower package PKG1.

The semiconductor package EX11 may be a stack package including the lower package PKG1 and the upper package PKG2. On a body wiring pad 27 of the lower package PKG1, a third external connection terminal 50, for example, a second solder ball, may be formed. The upper package PKG2 may be attached to the third external connection terminal 50.

The upper package PKG2 may include an upper chip 53 attached to an upper wiring substrate 51. The upper wiring substrate 51 may be electrically connected to the upper chip 53 through a bonding wire or a bump. Referring to FIG. 13, the upper chip 53 may be connected to the upper wiring substrate 51 by a bump (not shown). The upper chip 53 may be a memory chip. Examples of the memory chip may be the same as those described above.

The upper package PKG2 may include an upper encapsulation layer 55 surrounding at least a portion of the upper chip 53. The upper encapsulation layer 55 may include or may be, for example, an EMC. It is illustrated that the upper encapsulation layer 55 covers an inactive surface of the upper chip 53 (an upper surface of the upper chip 53), but one or more embodiments are not limited thereto.

Figure 14:
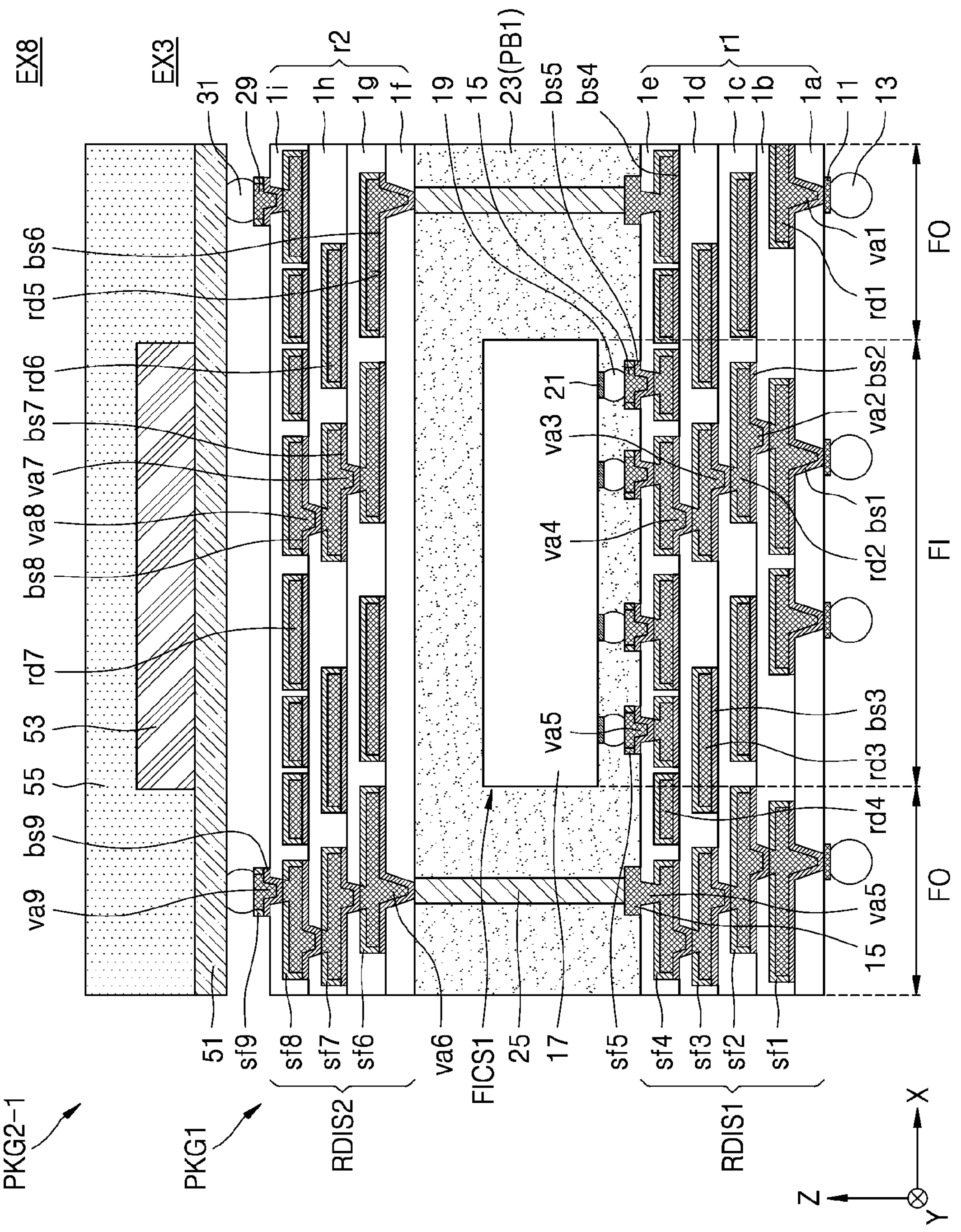
FIG. 14 is a cross-sectional view of a semiconductor package according to an embodiment.

FIG. 14 is a cross-sectional view of a semiconductor package according to an embodiment.

In detail, a semiconductor package EX8 may be substantially the same as the semiconductor package EX3 of FIG.

9 except that an upper package PKG2-1 is further stacked. The upper package PKG2-1 may be the same as the upper package PKG2 of FIG. 13.

The descriptions provided with reference to FIGS. 9 and 13 are briefly repeated or omitted in FIG. 14. Here, the semiconductor package EX3 of FIG. 9 is referred to as a lower package PKG1-1. The semiconductor package EX8 may be a stack package including the lower package PKG1-1 and the upper package PKG2-1. The upper package PKG2-1 may be attached to the second external connection terminal 31 formed on the second redistribution structure RDIS2 of the lower package PKG1-1. Semiconductor packages according to the one or more embodiments are suggested, but any combination of the one or more embodiments may be included in the scope of the inventive concept.

Figure 15:
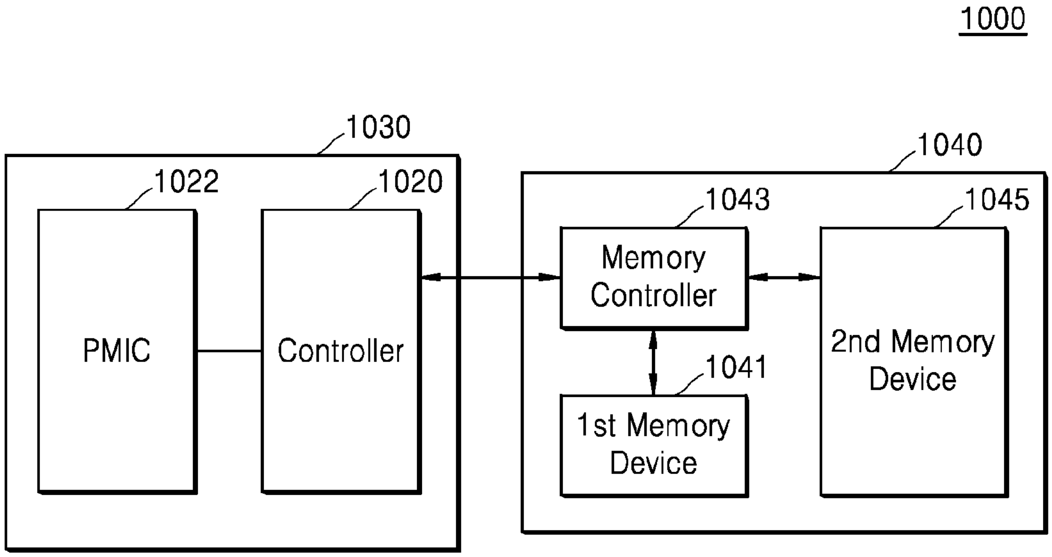
FIG. 15 is a block diagram of a structure of a semiconductor package, according to an embodiment.

FIG. 15 is a block diagram of a structure of a semiconductor package, according to an embodiment.

In detail, a semiconductor package 1000 may be any one of the semiconductor packages EX1 to EX8. The semiconductor package 1000 may include a controller (or controller chip) 1020, a first memory device (or a first memory chip) 1041, a second memory device (or a second memory chip) 1045, and a memory controller 1043. The semiconductor package 1000 may further include a power management integrated circuit (PMIC) 1022 supplying a current of an operation voltage to each of the controller 1020, the first memory device 1041, the second memory device 1045, and the memory controller 1043. An operation voltage applied to each component may be identically or differently designed.

A lower package 1030 including the controller 1020 and the PMIC 1022 may include any one of the semiconductor packages EX1 to EX8 described above. An upper package 1040 including the first memory device 1041, the second memory device 1045, and the memory controller 1043 may include any one of the semiconductor packages EX1 to EX8 described above.

The semiconductor package 1000 may be realized to be included in a personal computer (PC) or a mobile device. The mobile device may be realized as a laptop, a mobile phone, a smartphone, a tablet PC, a Personal Digital Assistant (PDA), an Enterprise Digital Assistant (EDA), a digital still camera, a digital video camera, a Portable Multimedia Player (PMP), a Personal Navigation Device or a Portable Navigation Device (PND), a handheld game console, a Mobile Internet Device (MID), a wearable computer, an Internet of Things (IoT) device, an Internet of Everything (IoE) device, or a drone.

The controller 1020 may control the operation of each of the first memory device 1041, the second memory device 1045, and the memory controller 1043. For example, the controller chip 1020 may be realized as an Integrated Circuit (IC), a System on Chip (SoC), an AP, a mobile AP, a chip set, or a set of chips. The controller 1020 may include a CPU, a GPU, and/or a modem. In some embodiments, the controller 1020 may perform functions of the modem and the AP.

The memory controller 1043 may control the second memory device 1045 according to the control of the controller 1020. The first memory device 1041 may be realized as a volatile memory device. The volatile memory device may be RAM, DRAM, or SRAM, but one or more embodiments are not limited thereto. The second memory device 1045 may be realized as a storage memory device. The storage memory device may be realized as a non-volatile memory device.

The storage memory device may be realized as a flash-based memory device, but one or more embodiments are not limited thereto. The second memory device 1045 may be realized as a NAND flash memory device. The NAND flash memory device may include a two-dimensional memory cell array or a three-dimensional memory cell array. The two-dimensional memory cell array or the three-dimensional memory cell array may include a plurality of memory cells, and in each memory cell, one-bit information or information of two or more bits may be stored.

When the second memory device 1045 is realized as a flash-based memory device, the memory controller 1043 may use (or support) a multimedia card (MMC) interface, an embedded MMC (eMMC) interface, or a universal flash storage (UFS) interface, but one or more embodiments are not limited thereto.

Figure 16:
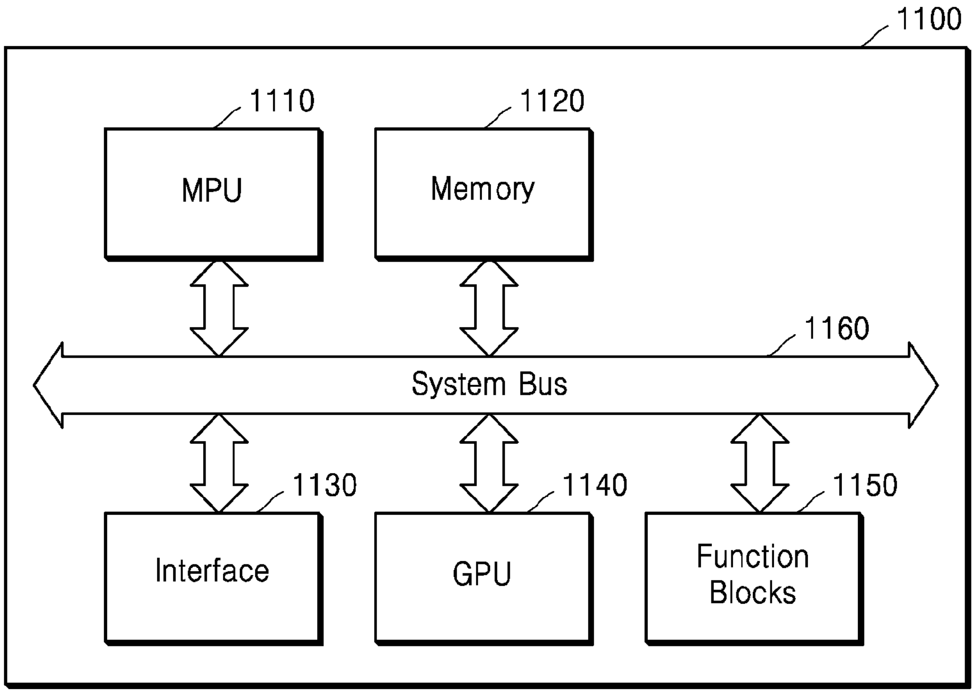
FIG. 16 is a schematic block diagram of a structure of a semiconductor package, according to an embodiment.

FIG. 16 is a schematic block diagram of a structure of a semiconductor package, according to an embodiment.

In detail, a semiconductor package 1100 may include a microprocessor unit (MPU) 1110, a memory 1120, an interface 1130, a GPU 1140, function blocks 1150, and a system bus 1160 connecting the above-listed components to each other. The semiconductor package 1100 may include both the MPU 1110 and the GPU 1140, but include any one thereof.

The MPU 1110 may include a core and an L2 cache. For example, the MPU 1110 may include a multi-core. Each one of the multi-core may have the same or different performance. Also, each of the multi-core may be activated simultaneously or in different points in time. The memory 1120 may store therein results processed by the function blocks 1150 under the control of the MPU 1110. For example, as content stored in the L2 cache of the MPU 1110 is flushed, the content may be stored in the memory 1120. The interface 1130 may perform interface with external devices. For example, the interface 1130 may perform interface with a camera, a liquid crystal display (LCD), a speaker, or the like.

The GPU 1140 may perform graphic functions. For example, the GPU 1140 may perform video codec or process three-dimensional graphics. The function blocks 1150 may perform various functions. For example, when the semiconductor package 1100 is an AP used in a mobile device, some of the function blocks 1150 may perform a communication function.

The semiconductor package 1100 may include any one of the semiconductor packages EX1 to EX8 described above. The MPU 1110 and/or the GPU 1140 may include any one of the semiconductor packages EX1 to EX8 described above. The memory 1120 may include any one of the semiconductor packages EX1 to EX8 described above. The interface 1130 and the function blocks 1150 may include any one of the semiconductor packages EX1 to EX8 described above.

While the inventive concept has been particularly shown and described with reference to embodiments thereof, it will be understood that various changes in form and details may be made therein without departing from the spirit and scope of the following claims.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper," "top," "bottom," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

What is claimed is:

1. A semiconductor package comprising:

a first redistribution structure including a top surface;

a chip arranged on the top surface of the first redistribution structure, the chip having a top surface, bottom surface, and side surfaces; and a package body arranged on the top surface of the first redistribution structure to cover the side surfaces of the chip, wherein the first redistribution structure comprises:

a plurality of redistribution layers stacked in a vertical direction;

a plurality of redistribution insulating layers stacked in the vertical direction and which insulate the plurality of redistribution layers from each other;

a plurality of redistribution vias buried in a plurality of redistribution via holes penetrating the plurality of redistribution insulating layers and electrically connecting the plurality of redistribution layers to each other; and a plurality of self-formed barrier layers formed between side surfaces of the plurality of redistribution layers and the plurality of redistribution insulating layers.

2. The semiconductor package of claim 1, further comprising a plurality of barrier seed layers formed on lower surfaces of the plurality of redistribution layers and side surfaces and lower surfaces of the plurality of redistribution vias and between the plurality of redistribution insulating layers.

3. The semiconductor package of claim 1, wherein the plurality of self-formed barrier layers each comprise a metal oxide layer.

4. The semiconductor package of claim 1, wherein:

each of the plurality of redistribution layers comprises a metal alloy comprising base metal comprising copper (Cu) and doping metal doped in the base metal, the doping metal comprises chromium (Cr) or cobalt (Co), and the plurality of redistribution insulating layers each comprise a polymer insulating layer comprising oxygen atoms.

5. The semiconductor package of claim 4, wherein, in the plurality of redistribution layers, the doping metal is included in the base metal in a range from about 0.1 wt % to about 3 wt %.

6. The semiconductor package of claim 1, wherein:

each of the plurality of redistribution layers comprises a metal alloy comprising base metal comprising copper (Cu) and doping metal doped in the base metal, the doping metal comprises any one selected from among vanadium (V), iron (Fe), manganese (Mn), titanium (Ti), molybdenum (Mo), nickel (Ni), zinc (Zn), magnesium (Mg), and aluminum (Al), and the plurality of redistribution insulating layers each comprise a polymer insulating layer comprising oxygen atoms.

7. The semiconductor package of claim 1, wherein a width of the first redistribution structure is greater than a width of the chip.

8. The semiconductor package of claim 1, wherein the package body comprises an encapsulation layer, and further comprising:

a body wiring structure in the encapsulation layer and electrically connected to the first redistribution structure.

9. The semiconductor package of claim 8, further comprising a second redistribution structure arranged on an upper surface of the package body and electrically connected to the body wiring structure, the second redistribution structure including:

a plurality of second redistribution layers stacked in a vertical direction;

a plurality of second redistribution insulating layers stacked in the vertical direction and which insulate the plurality of second redistribution layers from each other;

a plurality of second redistribution vias buried in a plurality of second redistribution via holes penetrating the plurality of second redistribution insulating layers and electrically connecting the plurality of second redistribution layers to each other; and a plurality of self-formed barrier layers formed between side surfaces of the plurality of second redistribution layers and the plurality of second redistribution insulating layers.

10. The semiconductor package of claim 1, wherein:

the package body comprises a substrate comprising a body through hole arranged in an internal area of the package body, wherein the substrate comprises a semiconductor substrate or a wiring substrate, the chip is embedded in the body through hole and sealed by an encapsulation layer, and a body wiring structure electrically connected to the first redistribution structure is arranged in the substrate.

11. A semiconductor package comprising:

a first redistribution structure including a top surface;

a chip arranged on the top surface of the first redistribution structure, the chip having a top surface, bottom surface, and side surfaces; and a package body arranged on the first redistribution structure to cover the side surfaces of the chip, wherein the first redistribution structure comprises:

a plurality of redistribution layers stacked in a vertical direction;

a plurality of redistribution insulating layers stacked in the vertical direction and which insulate the plurality of redistribution layers from each other;

a plurality of redistribution vias buried in a plurality of redistribution via holes penetrating the plurality of redistribution insulating layers and electrically connecting redistribution layers of the plurality of redistribution layers to each other;

a plurality of barrier layers formed between upper surfaces and side surfaces of the plurality of redistribution layers and the plurality of redistribution insulating layers; and a plurality of barrier seed layers formed on lower surfaces of the plurality of redistribution layers and side surfaces and lower surfaces of the plurality of redistribution vias and between the plurality of redistribution insulating layers.

12. The semiconductor package of claim 11, wherein the plurality of barrier layers each comprise a metal oxide layer resulting from a reaction of doping metal doped in a base metal constituting the plurality of redistribution layers with oxygen in the plurality of redistribution insulating layers.

13. The semiconductor package of claim 11, wherein:

each of the plurality of redistribution layers comprises a metal alloy comprising base metal comprising copper (Cu) and doping metal doped in the base metal, the doping metal comprises chromium (Cr) or cobalt (Co), the doping metal is included in the base metal in a range from about 0.1 wt % to about 3 wt %, and the plurality of redistribution insulating layers each comprise a polymer insulating layer comprising oxygen atoms.

14. The semiconductor package of claim 11, wherein:

each of the plurality of redistribution layers comprises a metal alloy comprising base metal comprising copper (Cu) and doping metal doped in the base metal, the doping metal comprises any one selected from among vanadium (V), iron (Fe), manganese (Mn), titanium (Ti), molybdenum (Mo), nickel (Ni), zinc (Zn), magnesium (Mg), and aluminum (Al), the doping metal is included in the base metal in a range from about 0.1 wt % to about 3 wt %, and the plurality of redistribution insulating layers each comprise a polymer insulating layer comprising oxygen atoms.

15. The semiconductor package of claim 11, wherein:

a width of the first redistribution structure is greater than a width of the chip, the package body comprises an encapsulation layer, a body wiring structure is formed in the encapsulation layer and is electrically connected to the first redistribution structure, a second redistribution structure is arranged on an upper surface of the package body and electrically connected to the body wiring structure, and the second redistribution structure includes a plurality of self-formed barrier layers formed between upper surfaces and side surfaces of a plurality of redistribution layers and a plurality of redistribution insulating layers.

16. A semiconductor package comprising:

a first redistribution structure having a top surface;

a chip arranged on the top surface of the first redistribution structure, the chip having a top surface, bottom surface, and side surfaces; and a package body arranged on the first redistribution structure to cover the side surfaces of the chip, wherein the first redistribution structure comprises:

a plurality of redistribution layers stacked in a vertical direction;

a plurality of redistribution insulating layers that insulate the plurality of redistribution layers from each other;

a plurality of redistribution vias buried in a plurality of redistribution via holes penetrating the plurality of redistribution insulating layers and electrically connecting the plurality of redistribution layers to each other; and a plurality of barrier layers formed between upper surfaces, side surfaces, and lower surfaces of the plurality of redistribution layers and the plurality of redistribution insulating layers, and between side surfaces of the plurality of redistribution vias and the plurality of redistribution insulating layers.

17. The semiconductor package of claim 16, wherein each of the plurality of barrier layers comprises a metal oxide layer resulting from a reaction of doping metal doped in base metal, which constitutes the plurality of redistribution layers, with oxygen included in the plurality of redistribution insulating layers.

18. The semiconductor package of claim 16, wherein:

each of the plurality of redistribution layers comprises a metal alloy comprising base metal comprising copper (Cu) and doping metal doped in the base metal, the doping metal comprises chromium (Cr) or cobalt (Co), the doping metal is included in the base metal in a range from about 0.1 wt % to about 3 wt %, and the plurality of redistribution insulating layers each comprise a polymer insulating layer comprising oxygen atoms.

19. The semiconductor package of claim 16, wherein:

each of the plurality of redistribution layers comprises a metal alloy comprising base metal comprising copper (Cu) and doping metal doped in the base metal, the doping metal comprises any one selected from among vanadium (V), iron (Fe), manganese (Mn), titanium (Ti), molybdenum (Mo), nickel (Ni), zinc (Zn), magnesium (Mg), and aluminum (Al), the doping metal is in the base metal in a range from about 0.1 wt % to about 3 wt %, and the plurality of redistribution insulating layers each comprise a polymer insulating layer comprising oxygen atoms.

20. The semiconductor package of claim 16, wherein:

a width of the first redistribution structure is greater than a width of the chip, the package body comprises a substrate comprising a body through hole arranged in an internal area of the package body, wherein the substrate comprises a semiconductor substrate or a wiring substrate, the chip is embedded in the body through hole and sealed by an encapsulation layer, a body wiring structure is formed in the substrate and is electrically connected to the first redistribution structure, a second redistribution structure is arranged on an upper surface of the package body and electrically connected to the body wiring structure, and the second redistribution structure includes barrier layers having the same structure as the barrier layers of the first redistribution structure.

* * * * *